(12) United States Patent
Gajiwala et al.

(10) Patent No.: US 12,061,748 B2
(45) Date of Patent: Aug. 13, 2024

(54) SYSTEM AND METHOD FOR A SINGLE SURFACE PALMREST WITH LOCALIZED HAPTICS FOR TOUCHPAD AND TACTILE FEEDBACK

(71) Applicant: Dell Products, LP, Round Rock, TX (US)

(72) Inventors: Priyank J. Gajiwala, Austin, TX (US); Nicholas G. DiLoreto, Georgetown, TX (US); Brian J. Yates, Cedar Park, TX (US); Joseph McDonald, Austin, TX (US); Duck Soo Choi, Georgetown, TX (US); Mark A. Schwager, Cedar Park, TX (US)

(73) Assignee: DELL PRODUCTS LP, Round Rock, TX (US)

(*) Notice: Subject to any disclaimer, the term of this patent is extended or adjusted under 35 U.S.C. 154(b) by 275 days.

(21) Appl. No.: 17/510,928

(22) Filed: Oct. 26, 2021

(65) Prior Publication Data

US 2023/0126612 A1 Apr. 27, 2023

(51) Int. Cl.
*G06F 3/02* (2006.01)
*G06F 1/16* (2006.01)
(Continued)

(52) U.S. Cl.
CPC ............ *G06F 3/0202* (2013.01); *G06F 3/016* (2013.01); *G06F 1/169* (2013.01); *H10N 30/20* (2023.02)

(58) Field of Classification Search
CPC ........ G06F 3/0202; G06F 3/016; G06F 1/169; G06F 1/1616; G06F 3/03547; H10N 30/20
See application file for complete search history.

(56) References Cited

U.S. PATENT DOCUMENTS 10,068,728 B2 9/2018 Huska
10,459,542 B1 10/2019 Costante
(Continued)

FOREIGN PATENT DOCUMENTS

CN 103123558 A * 5/2013
KR 20160017529 A * 2/2016
(Continued)

*Primary Examiner* — Quan Zhen Wang
*Assistant Examiner* — Mancil Littlejohn, Jr.
(74) *Attorney, Agent, or Firm* — Prol Intellectual Property Law, PLLC; H. Kenneth Prol

(57) ABSTRACT

A haptic touchpad may include a seamless layer of glass; a touchpad assembly, including: a capacitive touch printed circuit board (PCB) operatively coupled to a bottom side of the seamless layer of glass via a first adhesive; a contact foil operatively coupled to the bottom surface of the capacitive touch PCB via a second adhesive; a piezoelectric element array operatively coupled to a bottom side of the contact foil to receive an applied mechanical stress; and a controller of the information handling system operatively coupled to the piezoelectric element array to: receive electric actuation signals from the piezoelectric element array placed under the mechanical stress via the contact foil; and send an electrical response signal to the piezoelectric element array to cause the piezoelectric element array to generate haptic feedback; and a unibody C-cover support frame to support the touchpad assembly and the seamless layer of glass.

20 Claims, 15 Drawing Sheets

(51) Int. Cl.
*G06F 3/01* (2006.01)
*H10N 30/20* (2023.01)

(56) References Cited

U.S. PATENT DOCUMENTS

| | | | |
|---|---|---|---|
| 10,671,189 | B2 | 6/2020 | Costante |
| 10,761,571 | B1* | 9/2020 | Cooper .................. E05D 11/08 |
| 10,860,112 | B1 | 12/2020 | Knoppert |
| 11,079,849 | B1 | 8/2021 | Knoppert |
| 11,106,772 | B2 | 8/2021 | Knoppert |
| 11,419,231 | B1* | 8/2022 | Lancaster-Larocque .................... C03B 11/08 |
| 2008/0226829 | A1* | 9/2008 | Choate ............... C08G 18/6295 524/186 |
| 2017/0153703 | A1* | 6/2017 | Yun ........................ G06F 3/016 |
| 2018/0081477 | A1 | 3/2018 | Picciotto |
| 2018/0164910 | A1* | 6/2018 | Ent ......................... G06F 3/018 |
| 2019/0369759 | A1 | 12/2019 | Costante |
| 2020/0341584 | A1 | 10/2020 | Wang |
| 2021/0240266 | A1 | 8/2021 | Gajiwala |

FOREIGN PATENT DOCUMENTS

| | | |
|---|---|---|
| WO | 2019/117996 A1 | 6/2019 |
| WO | 2020/180289 A1 | 9/2020 |

\* cited by examiner

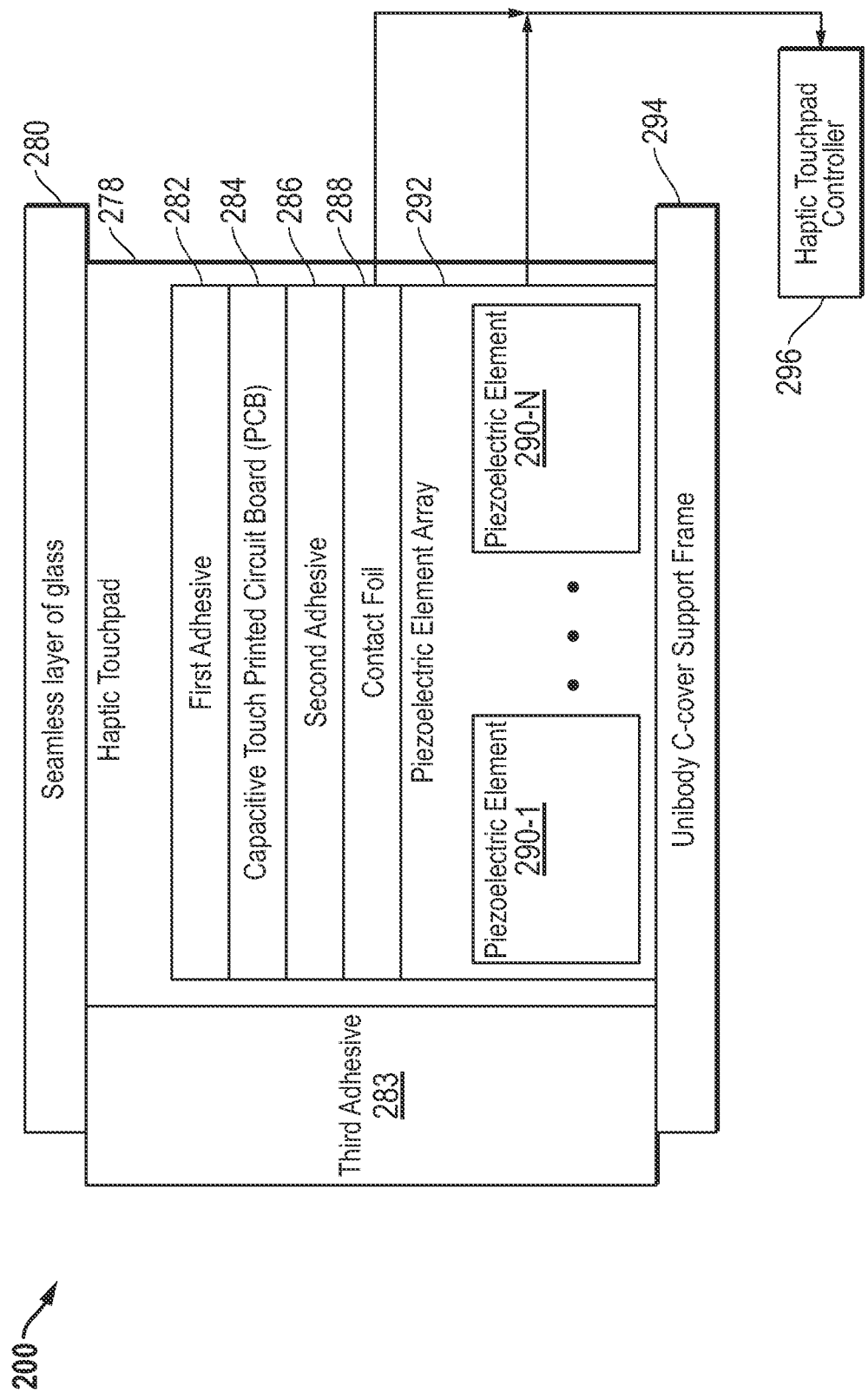

SYSTEM AND METHOD FOR A SINGLE SURFACE PALMREST WITH LOCALIZED HAPTICS FOR TOUCHPAD AND TACTILE FEEDBACK

FIELD OF THE DISCLOSURE

The present disclosure generally relates to a touchpad assembly of, for example, an information handling system. The present disclosure more specifically relates to the use of piezoelectric sensor and haptic generator elements in a touchpad of an information handling system.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling may vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. Further, the information handling system may include a keyboard, touchpad, or other input or output devices such as cursor control devices for manual input of information by the user.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which:

FIG. 2 is a block diagram illustrating a haptic touchpad assembly according to an embodiment of the present disclosure;

The use of the same reference symbols in different drawings may indicate similar or identical items.

DETAILED DESCRIPTION OF THE DRAWINGS

Figure 1:
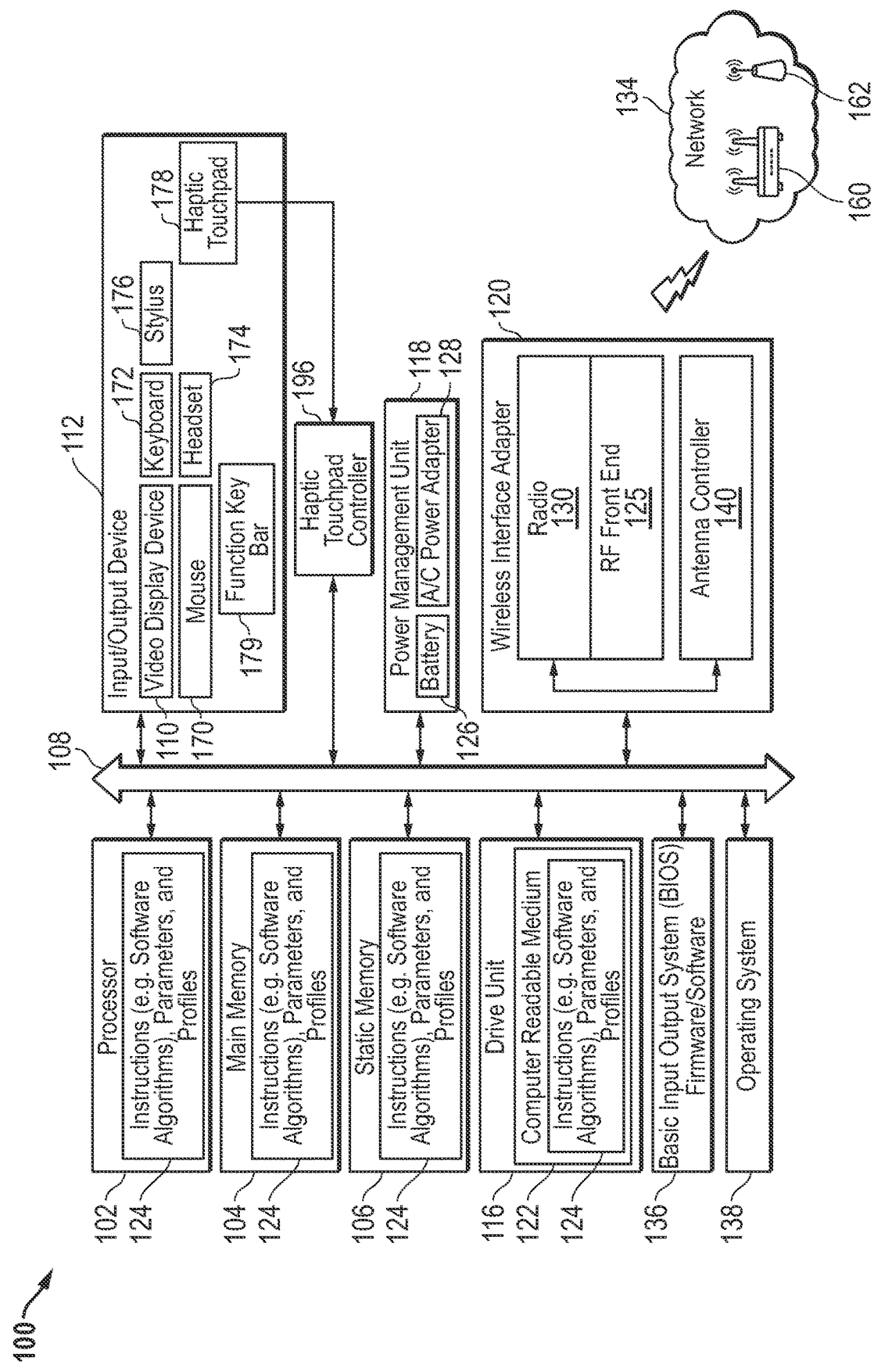
FIG. 1 is a block diagram illustrating an information handling system with a haptic touchpad according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Embodiments of the present disclosure provide for a haptic touchpad of an information handling system. The haptic touchpad may include, in an embodiment, a seamless layer of glass forming a palm rest and a touchpad surface. In an embodiment the seamless layer of glass may be operatively coupled to a portion of a unibody C-cover support frame. Additionally, a portion of the seamless layer of glass may be operatively coupled to a capacitive touch printed circuit board (PCB) used to receive input from a user when touched by a user. The capacitive touch PCB may form part of a touchpad assembly that includes a contact foil coupled to a bottom surface of the capacitive touch PCB and a piezoelectric element array operatively coupled to a bottom surface of the contact foil. In an embodiment, this touchpad assembly may be operatively coupled to a touchpad controller the detects the touch of a user at the capacitive touch PCB and a mechanical stress placed on the piezoelectric element array. The piezoelectric element array may include a plurality of piezoelectric elements that, when a mechanical stress is applied, generates an electric actuation signal that is received at the touchpad controller. In response, the touchpad controller may send an electrical response signal to these piezoelectric elements of the piezoelectric element array to generate haptic feedback against the user's touch.

In the context of the present specification, the term c-cover is describing a chassis structure of the information handling system typically associated with the keyboard and touchpad. For aesthetic, strength, and performance reasons, information handling system chassis parts may be more commonly designed with a metal structure. In an embodiment, a laptop-type information handling system, for example, may include a plurality of covers for the interior components of the information handling system. In these embodiments, a form factor case may include an "a-cover" which serves as a back cover for a display housing and a "b-cover" which may serve as the bezel, if any, and a display screen of the convertible laptop information handling system in an embodiment. In a further example, the laptop information handling system case may include a "c-cover" housing a keyboard, touchpad, speaker grill, and any cover in which these components are set and a "d-cover" base housing for the laptop information handling system. Within the c-cover and d-cover housing, the information handling system may include a battery, a cooling system, a processor, one or more memory devices and other components of the information handling system.

Embodiments of the present disclosure employ piezoelectric elements in order to provide haptic feedback at a touchpad. In the present specification and in the appended claims, the term "actuate" or "actuation" is meant to understood as an action that causes an operation and is referenced in connection with the operation of the touchpad described herein. In the context of the present disclosure, this includes the action by a user on the touchpad such as pressing against a location on a touchpad and movement of the user's touch along an operative surface of the touchpad. During actuation of the touchpad, a user may press against a visually unlabeled or labeled location on the touchpad. This actuation, according to the present disclosure, causes a mechanical strain on a piezoelectric element and, consequently, cause a buildup of electric charge in the piezoelectric element. This electric charge is detectable by a controller via the conductive contact foil with metal traces operatively coupled to the piezoelectric element. The detected electrical charge may be interpreted by the touchpad controller as an indication that the location on the touchpad was actuated with a press or "click." Thus, in an embodiment, the actuation by a user on the touchpad results in the controller sending an electrical signal back to the piezoelectric element via the metal traces of the conductive contact foil. When the electrical signal (having a current and voltage) is received at the piezoelectric element, the piezoelectric element may become rigid or contract in response to the deflection of the mechanical stress thereby creating the haptic feedback at that location on the touchpad as described herein. The electrical signal of current and voltage for haptic feedback may have varied waveforms in various embodiments such as a pulsed waveform, ramping waveform, various sinusoidal-type waveforms or the like to invoke various haptic feedback types at a location zone of the haptic touchpad surface over the piezoelectric element in embodiments herein.

The use of the seamless layer of glass may add an aesthetic appeal to the information handling system as well as for incorporation of hidden antenna systems, fingerprint readers, and light-emitting diode (LED) back lit icons and touch buttons, among other input and output components. The thickness of the touchpad assembly also reduces the space used within the information handling system and may be a little as 2.5 to 2.70 mm in thickness allowing for the touchpad assembly to be placed within the information handling system, for example, above a battery or other component of the information handling system. The haptic touchpad assembly, according to embodiments of the present disclosure, provides a thinner profile to make available a thinner information handling system or provide more internal space for other components such as a battery than previous touchpad designs. Additionally, the use of a single seamless layer of glass for the palm rest and the haptic touchpad may reduce the costs associated with manufacturing the information handling system and costs associated with parts used during the manufacturing processes.

Turning now to the figures, FIG. 1 illustrates an information handling system 100 similar to information handling systems according to several aspects of the present disclosure. In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 may be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP), a base station transceiver, a wireless telephone, a control system, a camera, a scanner, a printer, a pager, a personal trusted device, a web appliance, or any other suitable machine capable of executing a set of instructions (sequential or otherwise) that specify actions to be taken by that machine, and may vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the information handling system 100 may be implemented using electronic devices that provide voice, video or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or multiple sets, of instructions to perform one or more computer functions.

The information handling system may include memory (volatile (e.g., random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system 100 may include one or more storage devices, one or more communications ports for communicating with external devices, as well as various input and output (I/O) devices 112, such as a keyboard 114, the haptic touchpad 178 described herein, a function key bar 179, a mouse 170, a headset 174, a stylus 176, a video/graphic display 110, or any combination thereof. The information handling system 100 may also include one or more buses 108 operable to transmit communications between the various hardware components. Portions of an information handling system 100 may themselves be considered information handling systems 100.

Information handling system 100 may include devices or modules that embody one or more of the devices or execute instructions for the one or more systems and modules described herein, and operates to perform one or more of the methods described herein. The information handling system 100 may execute code instructions 124 that may operate on servers or systems, remote data centers, or on-box in individual client information handling systems according to various embodiments herein. In some embodiments, it is understood any or all portions of code instructions 124 may operate on a plurality of information handling systems 100.

The information handling system 100 may include a processor 102 such as a central processing unit (CPU), control logic or some combination of the same. Any of the processing resources may operate to execute code that is either firmware or software code. Moreover, the information handling system 100 may include memory such as main memory 104, static memory 106, or other memory of computer readable medium 122 storing instructions 124 executable by the haptic touchpad controller 196, and drive unit 116 (volatile (e.g., random-access memory, etc.), nonvolatile memory (read-only memory, flash memory etc.) or any combination thereof. The information handling system 100 may also include one or more buses 108 operable to transmit communications between the various hardware components such as any combination of various input and output (I/O) devices.

The information handling system 100 may further include a video display device 110. The video display device 110 in an embodiment may function as a liquid crystal display (LCD), an organic light emitting diode (OLED), a flat panel display, or a solid-state display. Additionally, the information handling system 100 may include an input device 112 that allows the user to interface with the information handling system 100 via the video display device 110, such as a cursor control device (e.g., mouse, haptic touchpad 178, or gesture or touch screen input), and a keyboard 114 or function key bar 179. Various drivers and control electronics may be operatively coupled to operate input devices 112 such as the haptic keyboard 110 and haptic touchpad 178 according to the embodiments described herein.

The network interface device in FIG. 1 is shown as wireless adapter 120 but may also be a wired network interface device as is understood in the art and may provide connectivity to a network 134, e.g., a wide area network (WAN), a local area network (LAN), wireless local area network (WLAN), a wireless personal area network (WPAN), a wireless wide area network (WWAN), or other network. The network interface device shown as wireless adapter 120 may provide connectivity to a network 134 via operation of a radio 130 and radio frequency (RF) front end 125 being controlled by an antenna controller 140. It is appreciated that any number of radios 130 and RF front ends 125 may be associated with a plurality of antennas. Connectivity may be via wired or wireless connection. The wireless adapter 120 may operate in accordance with any wireless data communication standards. To communicate with a wireless local area network, standards including IEEE 802.11 a/h/j/n/ac/ax WLAN standards, IEEE 802.15 WPAN standards, WWAN such as 3GPP or 3GPP2, or similar wireless standards may be used. In some aspects of the present disclosure, one wireless adapter 120 may operate two or more wireless links.

Wireless adapter 120 may connect to any combination of macro-cellular wireless connections including 2G, 2.5G, 3G, 4G, 5G or the like from one or more service providers or privately administered network providers. Wireless adapter 120 may also connect to any WLAN networks such as Wi-Fi networks. Utilization of radiofrequency communication bands according to several example embodiments of the present disclosure may include bands used with the WLAN standards and WWAN carriers, which may operate in both licensed and unlicensed spectrums.

In some embodiments, software, firmware, dedicated hardware implementations such as application specific integrated circuits, programmable logic arrays and other hardware devices may be constructed to implement one or more of some systems and methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations may include distributed processing, component/object distributed processing, and parallel processing. Alternatively, virtual computer system processing may be constructed to implement one or more of the methods or functionalities as described herein.

The present disclosure contemplates a computer-readable medium that includes instructions, parameters, and profiles 124 or receives and executes instructions, parameters, and profiles 124 responsive to a propagated signal, so that a device connected to a network 134 may communicate voice, video or data over the network 134. Further, the instructions 124 may be transmitted or received over the network 128 via the network interface device or wireless adapter 120.

The information handling system 100 may include a set of instructions 124 that may be executed to cause the computer system to perform any one or more of the methods or computer-based functions disclosed herein. For example, instructions 124 may be executed by a haptic touchpad controller 196, and may include software agents, or other aspects or components used to execute the methods and systems described herein. Various software modules comprising application instructions 124 may be coordinated by an operating system (OS), and/or via an application programming interface (API). An example operating system may include Windows®, Android®, and other OS types. Example APIs may include Win 32, Core Java API, or Android APIs.

The disk drive unit 116 may include a computer-readable medium 122 in which one or more sets of instructions 124 such as software may be embedded and executed by the haptic touchpad controller 196, in an embodiment. Similarly, main memory 104 and static memory 106 may also contain a computer-readable medium for storage of one or more sets of instructions, parameters, or profiles 124 including haptic feedback modulation instructions that allow for a user to input a desired level of haptic feedback at a location on the haptic touchpad 178 described herein. The disk drive unit 116 and static memory 106 may also contain space for data storage. Further, the instructions 124 may embody one or more of the methods or logic as described herein. For example, instructions relating to and executed by the haptic touchpad controller 196, software algorithms, processes, and/or methods may be stored here. In a particular embodiment, the instructions, parameters, and profiles 124 may reside completely, or at least partially, within the main memory 104, the static memory 106, and/or within the disk drive 116 during execution by the processor 102 of information handling system 100. As explained, some or all of the instructions 124 to be executed by a processor 102 for software applications or the haptic touchpad controller 196 may be executed locally, remotely or a combination thereof. The main memory 104 and the processor 102 also may include computer-readable media.

Main memory 104 may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The computer executable instructions 124 to be executed by the haptic touchpad controller 196 may be stored in static memory 106, or the drive unit 116 on a computer-readable medium 122 such as a flash memory or magnetic disk in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium may include a solid-state memory such as a memory card or other package that houses one or more non-volatile read-only memories. Further, the computer-readable medium may be a random-access memory or other volatile re-writable memory. Additionally, the computer-readable medium may include a magneto-optical or optical medium, such as a disk or tapes or other storage device to store information received via carrier wave signals such as a signal communicated over a transmission medium. Furthermore, a computer readable medium may store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

The information handling system 100 may also include the haptic touchpad controller 196 that may be operably connected to the bus 108. The computer readable medium 122 associated with the haptic touchpad controller 196 may also be provided space within one of the data storage devices described herein. The haptic touchpad controller 196 may, according to the present description, perform tasks related to receiving an electric charge from a piezoelectric element of a piezoelectric element array in haptics touchpad 178 and return an electrical charge to that piezoelectric element causing haptic feedback at a location on the haptic touchpad 178 associated with that piezoelectric element. In these embodiments, the haptic touchpad controller 196 may detect the receipt of an electric charge from any of a plurality of piezoelectric element each associated with a regional location on the haptic touchpad 178. Input may be received by the haptic touchpad controller 196 either simultaneously or concurrently so as to provide a return electrical charge to the corresponding piezoelectric elements within that regional location of the haptic touchpad 178 as described herein. Haptic touchpad 178 and haptic touchpad controller are described further in FIG. 2.

In an embodiment, the haptic touchpad controller 196 may communicate with the main memory 104, the processor 102, the video display 110, the keyboard 172, and the wireless interface device 120 via bus 108, and several forms of communication may be used, including ACPI, SMBus, a 24 MHZ BFSK-coded transmission channel, or shared memory. Keyboard driver software, haptic touchpad 178 driver software, firmware, controllers and the like may communicate with applications on the information handling system 100.

In other embodiments, dedicated hardware implementations such as application specific integrated circuits, programmable logic arrays and other hardware devices may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

When referred to as a "system", a "device," a "module," a "controller," or the like, the embodiments described herein may be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCM-CIA) card, or other such expansion card), or a system (such as a motherboard, a system-on-a-chip (SoC), or a standalone device). The system, device, controller, or module may include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module may also include a combination of the foregoing examples of hardware or software. In an embodiment an information handling system 100 may include an integrated circuit or a board-level product having portions thereof that may also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another may communicate directly or indirectly through one or more intermediaries.

The information handling system 100 may further include a power management unit (PMU) 118 (a.k.a. a power supply unit (PSU)). The PMU 118 may manage the power provided to the components of the information handling system 100 such as the processor 102, a cooling system, one or more drive units 116, a graphical processing unit (GPU), a video/graphic display device or other input/output devices 114, and other components that may require power when a power button has been actuated by a user. In an embodiment, the PMU 118 may monitor power levels and be electrically coupled to the information handling system 100 to provide this power and coupled to bus 108 to provide or receive data or instructions. The PMU 118 may regulate power from a power source such as a battery 126 or A/C power adapter 128. In an embodiment, the battery 126 may be charged via the A/C power adapter 128 and provide power to the components of the information handling system 100 when A/C power from the A/C power adapter 128 is removed.

The information handling system 100 may include one or more of an operating system (OS) 138, and basic input/output system (BIOS) firmware/software 136 or application programs that may be executable instructions 124 executed at any processor 102 and stored at one or more memory devices 104, 106, or 116. BIOS firmware/software 136 functions to initialize the information handling system 100 on power up, to launch an OS 138, and to manage input and output interactions between the OS 138 and the other elements of information handling system 100 including the haptic touchpad 178 and haptic touchpad controller 196 described herein. In a particular embodiment, BIOS firmware/software 136 resides in memory 104, and include machine-executable code that is executed by processor 102 to perform various functions of information handling system 100 as described herein. In another embodiment (not illustrated), application programs and BIOS firmware/software 136 reside in another storage medium of the information handling system 100. For example, application programs and BIOS firmware/software 110 can reside in drive 116, in a ROM (not illustrated) associated with the information handling system 100, in an option-ROM (not illustrated) associated with various devices of the information handling system 100, in a storage system (not illustrated) associated with network channel of a wireless interface adapter 120, in another storage medium of the information handling system 100, or a combination thereof. Executable code instructions 124 for application programs and BIOS firmware/software 136 can each be implemented as single programs, or as separate programs carrying out the various features as described herein.

FIG. 2 is a block diagram illustrating a haptic touchpad assembly for use with an information handling system according to embodiments of the present disclosure. As described herein, the haptic touchpad controller 296 may interface with the haptic touchpad 278 in order to detect an interaction between a user and the haptic touchpad 278. This interaction between the user and the haptic touchpad 278 may be completed by a user's actuations at the haptic touchpad 278 in order to provide input to the information handling system via the haptic touchpad 278. The haptic touchpad 278 may be arranged in a stack formation that includes a seamless layer of glass 280, a first adhesive 282 used to secure a capacitive touch printed circuit board (PCB) 284 to a bottom side of the seamless layer of glass 280, a second adhesive 286 used to operatively couple a contact foil 288 to the bottom side of the capacitive touch PCB 284. The stack of the haptic touchpad 278 may further include a piezoelectric element array 292 including one or more piezoelectric elements 290-1, 290-N operatively coupled to the contact foil 288. In an embodiment, this stack forming the haptic touchpad 278 may be placed in a unibody c-cover support frame 294. While a seamless layer of glass 280 is depicted in FIG. 2, the seamless layer 280 may be a top seamless layer of the haptic touchpad assembly that may be of any other suitable material as understood by those of skill in the art for use with a touchpad.

The seamless layer of glass 280 may form a palm rest surface of the c-cover and include a top touchpad surface of the haptic touchpad 278 seamlessly integrated with the palm rest in embodiments herein. The touchpad surface of the seamless layer of glass 280 may provide haptic feedback to a user that is local to the haptic touchpad surface portion and not felt in the palm rest due to localized actuation of piezoelectric elements of the haptic touchpad assembly. Further, the haptic touchpad surface area of the seamless glass layer 280 may be etched or marked to designate the touchpad surface area in some embodiments or may be etched or otherwise formed with a tactile step for a lowered haptic touchpad area in the seamless layer of glass 280 as shown and described in FIG. 3A. The seamless layer of glass 280 may form part of a top surface of a base portion of a laptop-type information handling system in front of a keyboard closer to a user on the c-cover. In this example, embodiment, the laptop-type information handling system may include a base portion with a display portion operatively coupled to the base portion via a hinge mechanism. In this example embodiment, the seamless layer of glass 280 may be placed at a front, top location of the base portion of the laptop-type information handling system where a user may rest his or her hands on the information handling system and interact with the haptic touchpad 278 and keyboard. With the seamless layer of glass 280 being placed on the front, top portion of the base portion of the laptop-type information handling system, a remaining portion of the top of the base portion of the information handling system may be used to house, for example, the keyboard (e.g., a QWERTY-type keyboard), a function key bar, a speaker, one or more antennas, a stylus housing for a stylus as well as other input devices of the information handling system.

The seamless layer of glass 280 may be made of a durable glass that resists breakage. In an embodiment, the unibody c-cover support frame 294 may be formed to hold the seamless layer of glass 280 within the unibody c-cover support frame 294 with a side lip to protect and hold the seamless layer of glass 280. In this embodiment, the unibody c-cover support frame 294 may be made of a metal such as aluminum or other metals and alloys that prevent accidental damage to the seamless layer of glass 280. In an embodiment, the seamless layer of glass 280 may be made of an alkali-aluminosilicate sheet of glass such as Gorilla® glass produced by Corning®. Other types of glasses may be used and the present specification contemplates the use of these other glasses. In an embodiment, instead of the seamless layer of glass 280 being made of glass, a layer of ultraviolet light-cured, metal-oxide nanocoated composite material may be used. Other materials are contemplated that allow a user's touch at the capacitive touch PCB 284 at a planar (x, y) location on the touchpad to be detected during use and used for cursor control. In an embodiment, the seamless layer of glass 280 may include acid etching, mechanical etching, coloration or other optical indication that delineates the outer boundaries of the haptic touchpad 278 formed under the seamless layer of glass 280. This may allow a user to visually know where the actionable and actuatable portions of the haptic touchpad 278 begin and end and where input may be received as described herein. In an embodiment, the thickness of the seamless layer of glass 280 may be 0.5 mm or less. This allows the user to use less force to actuate the piezoelectric elements 290-1, 290-N and feel the haptic feedback accordingly while still having a mechanically durable glass layer.

In an embodiment, the seamless layer of glass 280 may include a transition face that creates a transition between a keyboard portion of the base portion of the information handling system. In this embodiment, an edge of the seamless layer of glass 280 may be beveled such that it interfaces seamlessly with the housing components of the keyboard portion. This beveling may be optically indiscernible by the user by may increase the aesthetics of the information handling system by appearing to be a single piece on the c-cover of the information handling system.

The first adhesive may be any type of adhesive that secures the capacitive touch PCB 284 to the bottom surface of the seamless layer of glass 280. In an embodiment, the first adhesive 282 is layered between the seamless layer of glass 280 and the capacitive touch PCB 284. In an embodiments, the first adhesive layer may have a thickness of about 0.03 mm to 0.07 mm. In another embodiment, first adhesive 282 is layered between the seamless layer of glass 280 and the capacitive touch PCB 284 having a thickness of about 0.5 mm.

The capacitive touch PCB 284 may be made of a flexible material such as a glass, biaxially-oriented polyethylene terephthalate (BoPET) such as Mylar® produced by DUPONT®, or a glass-reinforced epoxy such as FR4 that has a flexibility to it similar to the flexibility of the seamless layer of glass 280 described herein. The capacitive touch PCB 284, in an embodiment, includes a grid of drive and sense lines to determine x- and y-touch locations on capacitive touch PCB 284 by a user. The capacitive touch PCB 284 may be operatively coupled to a capacitive touch controller and driver for execution of cursor control functions with the information handling system OS for various applications. The capacitive touch PCB 284 may be placed above the layers of the haptic touchpad 278 to distribute forces from a user's finger through the capacitive touch PCB 284 and to the nearest or a plurality of nearest piezoelectric element 290-1, 290-N in the piezoelectric element array 292 formed below and across the bottom surface of the capacitive touch PCB 284.

In an embodiment, the c-cover may include a keyboard and above the keyboard may be a trim piece made of any suitable material including another seamless glass layer to match seamless glass layer 280 of the palm rest and haptic touchpad surface, a metal insert, plastic insert, or other material. In one particular embodiment, the size of the keyboard may be reduced in size by eliminating function keys and a function key bar may be included as part of the trim piece above the keyboard. In one example of such an embodiment, the trim piece may be made of glass similar to the seamless glass layer 280 and have another capacitive touch PCB similar to 284 made of a flexible material such as a glass, biaxially-oriented polyethylene terephthalate (BoPET) such as Mylar® produced by DUPONT®, or a glass-reinforced epoxy such as FR4 that has a flexibility to it similar to the flexibility of the seamless layer of glass used for the trim piece and for 280 as described herein. The capacitive touch PCB 284, in an embodiment, may include a grid of drive and sense lines to determine x- and y-touch locations on capacitive touch PCB 284 by a user for actuation of function keys across the trim piece by capacitive touch. The capacitive touch PCB 284 may be placed and adhered under the trim piece of glass and operatively coupled to a capacitive key bar driver executed via a touchpad controller.

In an embodiment, the capacitive touch PCB 284 of the haptics touchpad assembly may be operatively coupled to a top surface of the contact foil 288 via a second adhesive 286. In an embodiment, the second adhesive 286 may be layered between the bottom surface of the capacitive touch PCB 284 and the top surface of the contact foil 288 at a thickness of between 0.20 and 0.26 mm. In an embodiment, the second adhesive 286 may be layered between the bottom surface of the capacitive touch PCB 284 and the top surface of the contact foil 288 at a thickness of approximately 0.23. In an embodiment, the bottom surface of the capacitive touch PCB 284 and the top surface of the contact foil 288 may be coupled together using several dots of second adhesive 286 that each have a thickness of approximately 0.23 mm.

The contact foil 288 adhered to the bottom surface of the capacitive touch PCB 284 via the second adhesive 286 may be made of any elastically resilient material that, when the contact foil 288 is bent towards a lower portion of the haptic touchpad 278, returns to its original state when the haptic touchpad 278 is no longer being actuated by the user. The contact foil 288 is a flexible material, such as polyethylene terephthalate (PET) serving as a polyester printed circuit board or other type of flexible printed circuit board, in several example embodiments. The contact foil 288 may include a number of metal traces formed thereon that electrically and communicatively couple each of the corresponding piezoelectric elements 290-1, 290-N of the haptic touchpad 278 to a haptic touchpad controller 296 such as a processor of the information handling system. Formation of metal traces may be made according to a variety of methods including photolithographic techniques for applying metal or lamination of copper strips or other metal layers. During operation of the haptic touchpad 278, the contact foil 288 may receive an electrical charge from one or more of the piezoelectric elements 290-1, 290-N at the metal traces that conduct the electrical charge to the processor or other controller associated with haptic touchpad 278 such as the haptic touchpad controller 296. In some embodiments, rigid dots are formed above the flexible printed circuit board and situated above the piezo elements to focus applied mechanical stress to the seamless glass layer 280 at the touchpad surface portion to the piezo electric element beneath when actuated by a user with a press or click. This may allow the force on the seamless glass layer 280 to be more accurately delivered to each piezo element for determination of an actuation electrical signal by the haptics touchpad controller 296. The metal traces formed on the contact foil 288 may further be used to conduct a return haptic feedback control signal from the haptic touchpad controller 296 to the piezoelectric elements 290-1, 290-N of the piezoelectric element array 292 so that the voltage and current of the return haptic feedback control signal may cause the piezoelectric elements 290-1, 290-N to return an electric haptic signal to cause piezoelectric element 290-1, 290-N to become rigid and contract generating a specified haptic response to the user via the haptic touchpad 278 stack. This stiffening of the piezoelectric elements 290-1, 290-N may cause haptic feedback presented at the haptic touchpad 278 via the contact foil 288, second adhesive 286, capacitive touch PCB 284, first adhesive 282, and the seamless layer of glass 280 that the user may feel as a "clicking" or actuation sensation. This haptic feedback produced by this process may be relayed to the user within microseconds of the user actuating the haptic touchpad 278 such that the user physically detects a sensation that the haptic touchpad 278 was pressed. This sensation felt by the user may be present despite no actual mechanical devices such as a scissor mechanism or other types of touchpad mechanical device being present among the layers of the haptic touchpad 278. The signal to the piezoelectric element 290-1, 290-N may vary magnitude and pulsing to create the desired haptic response at the haptic touchpad 278.

Figure 5:
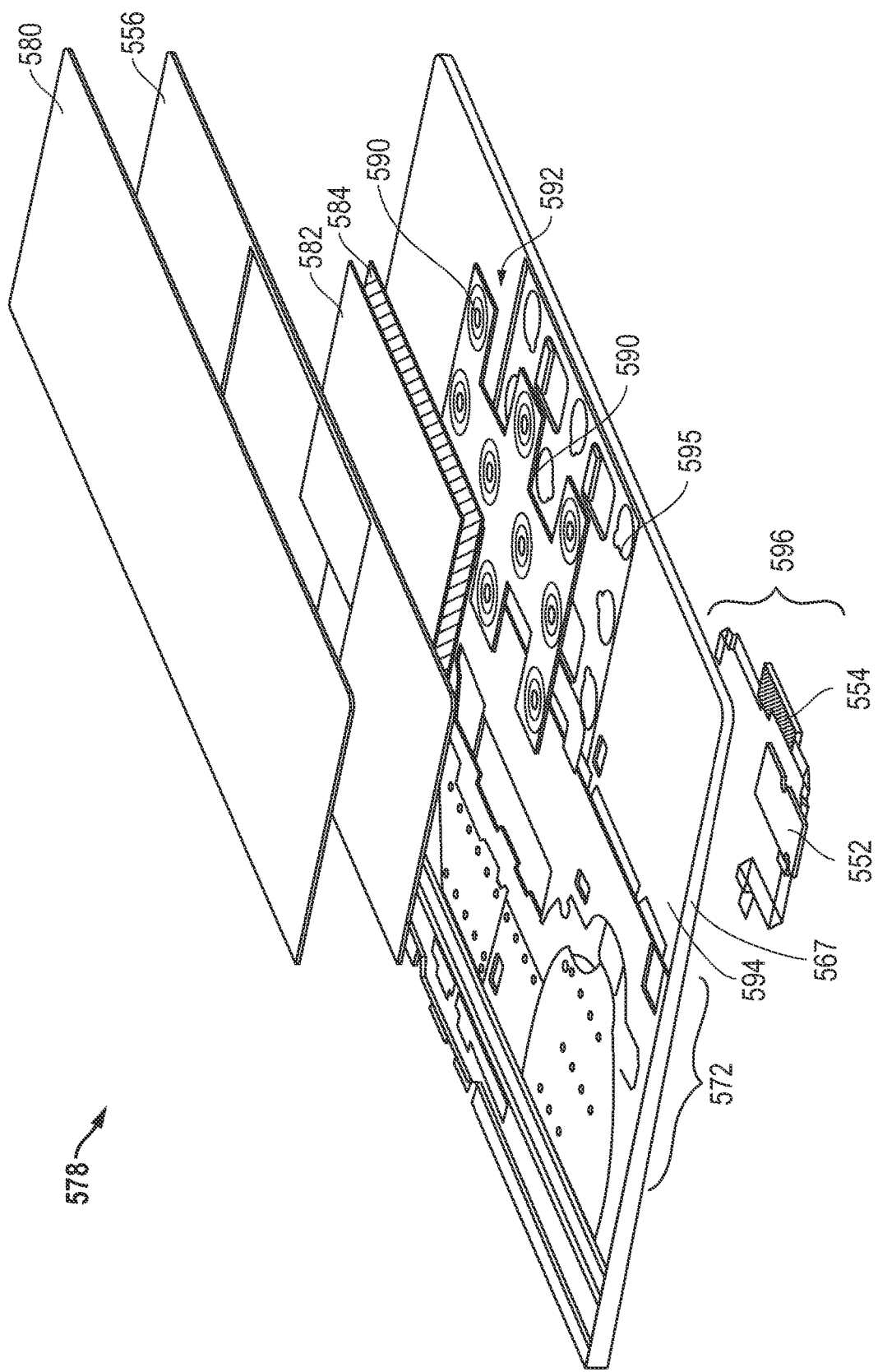
FIG. 5 is an exploded perspective view of an assembly of a haptic touchpad with a seamless layer of glass and unibody C-cover support frame according to another embodiment of the present disclosure.

The piezoelectric element 290-1, 290-N of the piezoelectric element array 292 may be arranged on and operatively coupled to an isolation tape or other type of substrate that prevents the arrangement of the piezoelectric elements 290-1, 290-N on the substrate to be changed. As described, each piezoelectric element 290-1, 290-N may include a first contact point between the piezoelectric element 290-1, 290-N and the contact foil 288 and a second contact point between the piezoelectric element 290-1, 290-N and the contact foil 288. In this embodiment, each of the piezoelectric elements 290-1, 290-N may be associated with two metal traces formed on the contact foil 288 and leading to the haptic touchpad controller 296. Each of these metal traces are used to either receive an electrical signal from one or more piezoelectric elements 290-1, 290-N and pass that electrical signal to the haptic touchpad controller 296. The haptic touchpad controller 296, when these electrical signals are received, may send a response electrical signal to the same piezoelectric element 290-1, 290-N along the second metal trace to make the piezoelectric element 290-1, 290-N rigid as described. In an embodiment, a group of piezoelectric elements 290-1, 290-N may each be actuated via the actuation of a user along the surface of the seamless layer of glass 280 where the haptic touchpad 278 has been formed to save power and limit actuation and haptic feedback sensation to the touchpad surface area without extending into a palm rest area of the seamless glass layer 280. In this example, the haptic touchpad controller 296 may interpret this actuation among the group of piezoelectric elements 290-1, 290-N as a localized haptic response and send a return actuation signal to the effected piezoelectric elements 290-1, 290-N to make each of these piezoelectric elements 290-1, 290-N rigid as they contract to generate a haptic feedback movement in the haptic touchpad surface area. In this embodiment, a number of remaining piezoelectric elements 290-1, 290-N not activated or bent via actuation of the user may not receive an electrical signal from the haptic touchpad controller 296 creating the localized haptic feedback as described. The arrangement and number of piezoelectric elements 290-1, 290-N may be set based on the planar size of the haptic touchpad 278, the size of the piezoelectric elements 290-1, 290-N, and the ability of a user to feel a localized, haptic feedback from the piezoelectric elements 290-1, 290-N. In an embodiment, the number of piezoelectric elements 290-1, 290-N is ten as shown in an example embodiment at FIG. 5. However, the present specification contemplates that any number of and arrangement of piezoelectric elements 290-1, 290-N is contemplated herein, and the example embodiments described are meant as examples that are not limiting the potential number of arrangements of piezoelectric elements 290-1, 290-N of the piezoelectric element array 292.

In an embodiment, the thickness of the second adhesive 286, contact foil 288, piezoelectric elements 290-1, 290-N, and substrate for the piezoelectric elements 290-1, 290-N of the piezoelectric element array 292 may be between approximately 0.8 and 0.84 mm. In an embodiment, the thickness of the second adhesive 286, contact foil 288, piezoelectric elements 290-1, 290-N, and substrate for the piezoelectric elements 290-1, 290-N of the piezoelectric element array 292 may be about 0.8 mm with the thickness of the second adhesive 286 being approximately 0.23 mm, the thickness of the contact foil 288 being 0.13 mm, the thickness of the piezoelectric elements 290-1, 290-N being approximately 0.31, and the thickness of the substrate of the piezoelectric element 290-1, 290-N being approximately 0.15.

As described herein, the stack of the haptic touchpad 278 may be placed within a unibody c-cover support frame 294. This unibody c-cover support frame 294 may be formed of aluminum or another lightweight metal that supports the pressure from a user actuating the haptic touchpad 278 by pressing down on the haptic touchpad 278. In an embodiment the unibody c-cover support frame 294 may include wells or other depressions formed to receive each of the piezoelectric elements 290-1, 290-N through the substrate of the piezoelectric element array 292. In this embodiment, the wells or other depressions may hold the piezoelectric elements 290-1, 290-N in place during use of the haptic touchpad 278. In an embodiment, the unibody c-cover support frame 294 may support only the seamless layer of glass 280, the capacitive touch PCB 284, and the piezoelectric element array 292. In another embodiment, the unibody c-cover support frame 294 may be used to also house a keyboard 272, a numerical keypad, or other input device as described herein. Although the unibody c-cover support frame 294 may form a portion of the c-cover of the information handling system, the c-cover may also include the upper surfaces of the keyboard 272 and haptic touchpad 278 as well according to some definitions of a c-cover.

The stack of the haptic touchpad 278 may further include a third adhesive 283 that secures the seamless layer of glass 280 to a top surface of the unibody c-cover support frame 294. This third adhesive 283 includes a window into which the first adhesive 282 is used to couple the capacitive touch PCB 284 to the bottom surface of the seamless layer of glass 280 within the window. In some example embodiments, the thickness of the third adhesive 283 may also vary from the thickness of the first adhesive 282. In an embodiment where the first adhesive 282 has a thickness of approximately 0.05 mm, the thickness of the third adhesive 283 may be between approximately 0.225 and 0.23 mm. This variance in layer thickness between the first adhesive 282 and the second adhesive 286 may allow for the small deflection of the seamless layer of glass 280 over the haptic touchpad 278 that is about 0.1 mm of deflection. With this relatively small amount of deflection the user may be able to both use the capacitive touch PCB 284 as well as actuate the piezoelectric elements 290-1, 290-N of the piezoelectric element array 292 as described in some embodiments herein. To also help facilitate the ability of the seamless layer of glass 280 to be deflected by about 0.1 mm at the haptic touchpad 278, the planar dimensions of the stack of the haptic touchpad 278 may be smaller than the size of the window formed in the third adhesive 283 in an example embodiment. This adhesive offset of the third adhesive 283 from the haptic touchpad 278 may be as little as 1 mm and a great as 4 mm. In an embodiment, the adhesive offset may be 1 mm between the top of the adhesive window in the third adhesive layer and the capacitive touch PCB, 1 mm between the bottom of the adhesive window in the third adhesive layer and the capacitive touch PCB, 4 mm between a left edge of the window in the third adhesive layer and the capacitive touch PCB, and 4 mm between a right edge of the window in the third adhesive layer and the capacitive touch PCB. This adhesive offset allows for deflection of the seamless layer of glass 280 into the haptic touchpad such that the relatively small deflection is detected by the piezoelectric elements 290-1, 290-N and haptic touchpad controller 296 as compared to a dive board-type touchpad.

In an embodiment, the one or more sets of instructions of the haptic touchpad controller 296 may also include, in an embodiment, one or more sets of instructions that, when executed by a processor, adjusts the voltage and current applied to any of the piezoelectric elements 290-1, 290-N. This adjustment may be completed based on the lifespan of the piezoelectric element, the electrical characteristics of the piezoelectric element, the mechanical characteristics of the piezoelectric element, or combinations thereof. Because these characteristics may be different from one piezoelectric element to the other, the electrical charge applied any given piezoelectric element 290-1, 290-N by the haptic touchpad controller 296 may be customized to produce a specific level of haptic feedback at the haptic touchpad 278. In an embodiment, the haptic touchpad controller 296 of the information handling system 200 may include a look-up table. In this embodiment, the haptic touchpad controller 296 of the information handling system 200 may access the look-up table in order to determine how a current pulse is to be applied to any given piezoelectric element 290-1, 290-N and at what voltage.

The one or more sets of instructions of the haptic touchpad controller 296 may also include one or more sets of instructions that causes any number of subsequent current pulses to be applied to any of the piezoelectric elements 290-1, 290-N. In this embodiment, the subsequent electrical pulses may cause a vibrating, haptic feedback to a user who actuated a portion of the haptic touchpad 278 of the information handling system 200 or changes in magnitude or pulses of haptic feedback to emulate the feel of a mechanical actuation including adjustment of the feel of depth of the haptic-emulated touch.

In an embodiment, the application of any current and voltage applied to any of the piezoelectric elements 290-1, 290-N associated with a location on the haptic touchpad 278 may be dependent on an application being executed on the information handling system 200. By way of example, a user may be engaged in providing input, via the haptic touchpad 278, to a processor of the information handling system 200 in order to cause output to be provided. In a specific embodiment, the information handling system 200 may execute a basic input/output system (BIOS). Upon execution of the BIOS, the haptic touchpad controller 296 may begin to detect electrical signals or charges emitted from one or more piezoelectric elements 290-1, 290-N being placed in a strain by the actuation of a corresponding location on the haptic touchpad 278. This may allow the haptic touchpad controller 296 to receive input at times when the information handling system 200 is in an on state. In an alternative embodiment, the execution of other application programs by a processor of the information handling system 200 such as a word processing application program may trigger the haptic touchpad controller 296 to begin to detect the electrical charges produced at any given piezoelectric element 290-1, 290-N of the piezoelectric element array 292. By deferring input received from the piezoelectric elements 290-1, 290-N at the haptic touchpad controller 296 or any other controller or processor, accidental input may be prevented by any errant touch of the haptic touchpad 278.

The haptic touchpad 278 may include a stack assembly similar to that depicted in FIG. 2 to form the haptic touchpad 278. This stack may include the seamless layer of glass 280 or other suitable material with a capacitive touch PCB 284 coupled to a bottom surface of the seamless layer of glass 280 via a first adhesive 282. The capacitive touch PCB 284 may be operatively coupled to a top side of a contact foil 288 via a second adhesive and the contact foil 288 may be operatively coupled to the haptic touchpad controller 296. The contact foil 288 may also be operatively coupled to the piezoelectric element array 292 and its individual piezoelectric elements 290-1, 290-N via a number of metal traces formed on the contact foil 288. The stack of the haptic touchpad 278 may further include a unibody c-cover support frame 294 used to support the stack and provide rigid resistance from actuation by a user so that the actuation force may be detected at one or more piezoelectric elements 290-1, 290-N via the contact foil 288 and haptic touchpad controller 296 as described herein. The haptic touchpad controller 296 may be offset away from the stack of the haptic touchpad 278 by may be operatively coupled to the contact foil 288 via, for example, an extension of the contact foil 288 extending out from a side of the stack of the haptic touchpad 278. The capacitive touch PCB 284 may also, in an embodiment, be operatively coupled to the haptic touchpad controller 296 via a connector. In an alternative embodiment, the capacitive touch PCB 284 may be operatively coupled to an independently operated controller that communicates with the haptic touchpad controller 296 to provide touch location data to the haptic touchpad controller 296 describing a detected location on the capacitive touch PCB 284 where a user's touch has been detected.

Figure 3A:
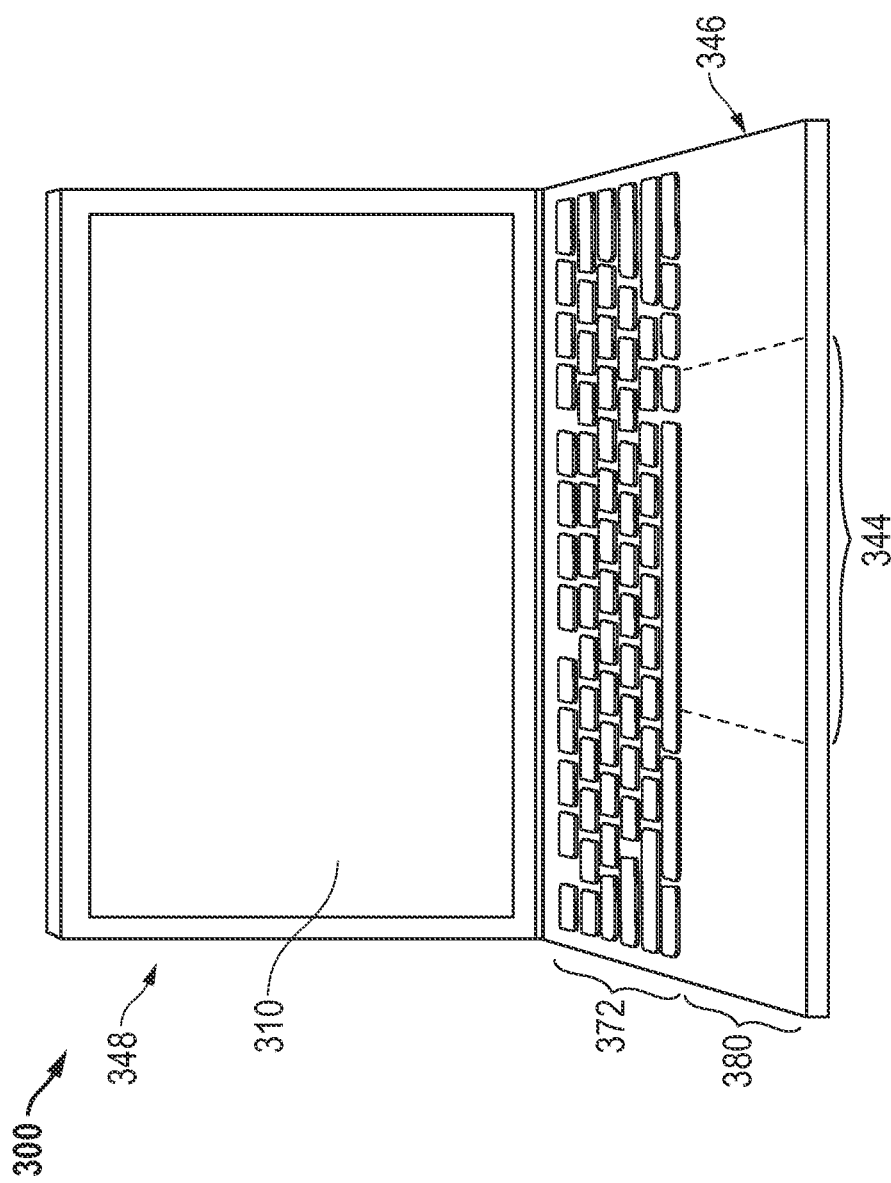
FIG. 3A is a perspective graphical diagram of an information handling system with a haptic touchpad according to an embodiment of the present disclosure.

FIG. 3A is a perspective graphical diagram of an information handling system 300 with a haptic touchpad situated under a haptic touchpad surface portion 344 of a seamless layer of glass or other material 344 to form a palm rest surface and haptic touchpad surface portion 344 according to an embodiment of the present disclosure. Although FIG. 3A depicts the information handling system 300 as being implemented in a laptop computing device, FIG. 3A is not meant to be limiting and the present specification contemplates that the use of other types of information handling systems as described herein such as a tablet-type laptop information handling system or a 360° convertible information handling system. In the example, the information handling system 300 may include a screen portion 310 and a keyboard portion 372 and touchpad surface portion 344. As described herein, the touchpad surface portion 344 may be formed as part of a seamless layer of glass portion 380 at a front, top side of the information handling system 300 that is closer on the c-cover 346 to a user than keyboard portion 372. The screen portion 310 may include any device that may present to a user any visual data as output to a user in response to input and execution of the instructions, parameters, and profiles by the processor described in connection with FIG. 1. In an example embodiment, a graphical user interface may be presented to a user to input any number of parameters descriptive of the actuation force used to actuate an actuation force at a location on the haptic touchpad 378. The graphical user interface (GUI) may also be used to receive other settings including actuation of a "click" when selecting items on screen portion 310 via a cursor using the haptic touchpad 378 force required, multiple levels of force and operations, and selection of magnitude, pattern, or other characteristics of the haptic response by the haptic touchpad 378.

The keyboard portion 372 may include any number of keys arranged in any manner so as to receive input from a user via selective actuation of those keys. In an embodiment, the keys may be arranged similar to a QWERTY-type keyboard layout or any other alphabetic, symbolic, or numeric layout. In an embodiment, the keys may be any number of keys from 1 to infinity.

In an embodiment, the touchpad portion 344 includes the haptic touchpad as described in connection with FIG. 2 and includes a capacitive touch PCB that indicates a touch location using x- and y-coordinates across the touch surface. In an embodiment, a piezoelectric element array with one or more piezoelectric elements may be placed under the touch surface such as the seamless layer of glass 380 or other material and capacitive touch PCB. Each of the piezoelectric elements among the piezoelectric element array may detect and respond to a mechanical stress in a downward direction by a user at haptic touchpad surface portion 344 by providing haptic feedback depending on the proximity of the piezoelectric elements to an actuation location across the surface of the haptic touchpad surface portion 344. The piezoelectric element array activates the touch surface and is a detect/response by one or more nearby piezoelectric elements. The piezoelectric elements create a "click" haptic feedback localized within the haptic touchpad surface portion 344 such as when a user selects an item displayed with the haptic touchpad.

The information handling system 300 may include a haptic touchpad controller as described herein. In an embodiment, the haptic touchpad controller may be the same controller that executes instructions, parameter, and profiles to enact the functions of the haptic touchpad including x, y cursor control and press or click actions such as for selection of items and sending such instructions to an operating system for display on display screen 310 as described herein. In an embodiment, the haptic touchpad controller may include one or more sets of instructions that, when executed, causes a current, at a voltage, to be applied to one or more piezoelectric elements upon detection of an electrical charge from those piezoelectric elements. The one or more sets of instructions of the haptic touchpad controller may also include one or more sets of instructions that determines which locations on the haptic touchpad surface portion 344 were activated.

Figure 3B:
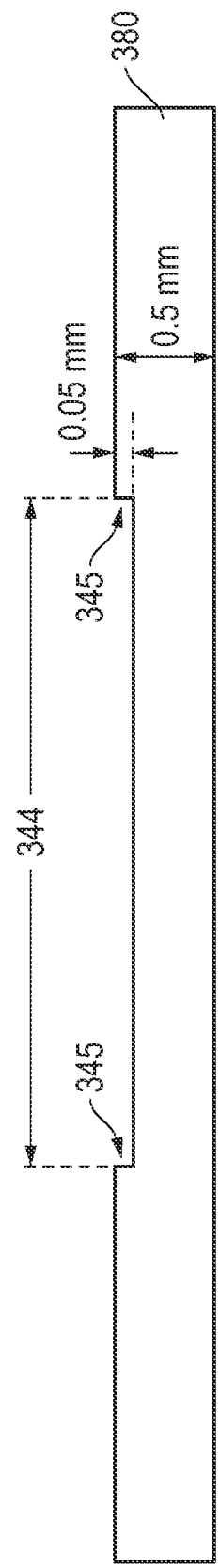
FIG. 3B is a cross-section diagram of a seamless glass layer for a haptic touchpad including a tactile step haptic touchpad surface according to an embodiment of the present disclosure.

FIG. 3B is a cross-section view of the seamless top layer 380 according to an embodiment of the present disclosure. The seamless top layer 380 may be of glass or other suitable material and may form a seamless palm rest surface portion to the sides of a haptics touchpad surface portion 344. In a shown embodiment, the seamless top layer 380 may be of a thickness of approximately 0.5 mm or less. For glass, above 0.5 mm may make determination of mechanical stress applied by a user to the haptic touchpad surface portion 344 difficult to detect by underlying piezo elements (not shown). Substantially thinner glass used for seamless top layer 380 may run into issues of durability such as below 0.2 mm thickness.

The seamless top layer 380 may be etched or otherwise marked in some embodiments to designate the location of the haptic touchpad surface portion 344 as the location of the haptic touchpad underneath. In the shown embodiment of FIG. 3, seamless top layer 380 may be formed, etched, or otherwise created by techniques known in the art for glass or other suitable materials to have a tactile step 345 formed on either side of the haptic touchpad surface portion 344. The tactile step may be subtle when viewed but provide a user with a tactile indication of the boundaries of the haptic touchpad surface portion 344 in an embodiment. In a particular embodiment, the tactile step 345 may form the haptic touchpad surface portion 344 to be approximately 0.05 mm lower into the seamless top layer 380. This may establish the tactile steps 345 while make the haptic touchpad surface portion 344 only slightly thinner for aesthetic purposes. Further, a slightly thinner haptic touchpad surface portion 344 may allow for better piezo electric response to mechanical stress applied by a user during a press or "click" actuation of the haptic touchpad due to more flex at this portion of the seamless top layer 380.

Figure 4A:
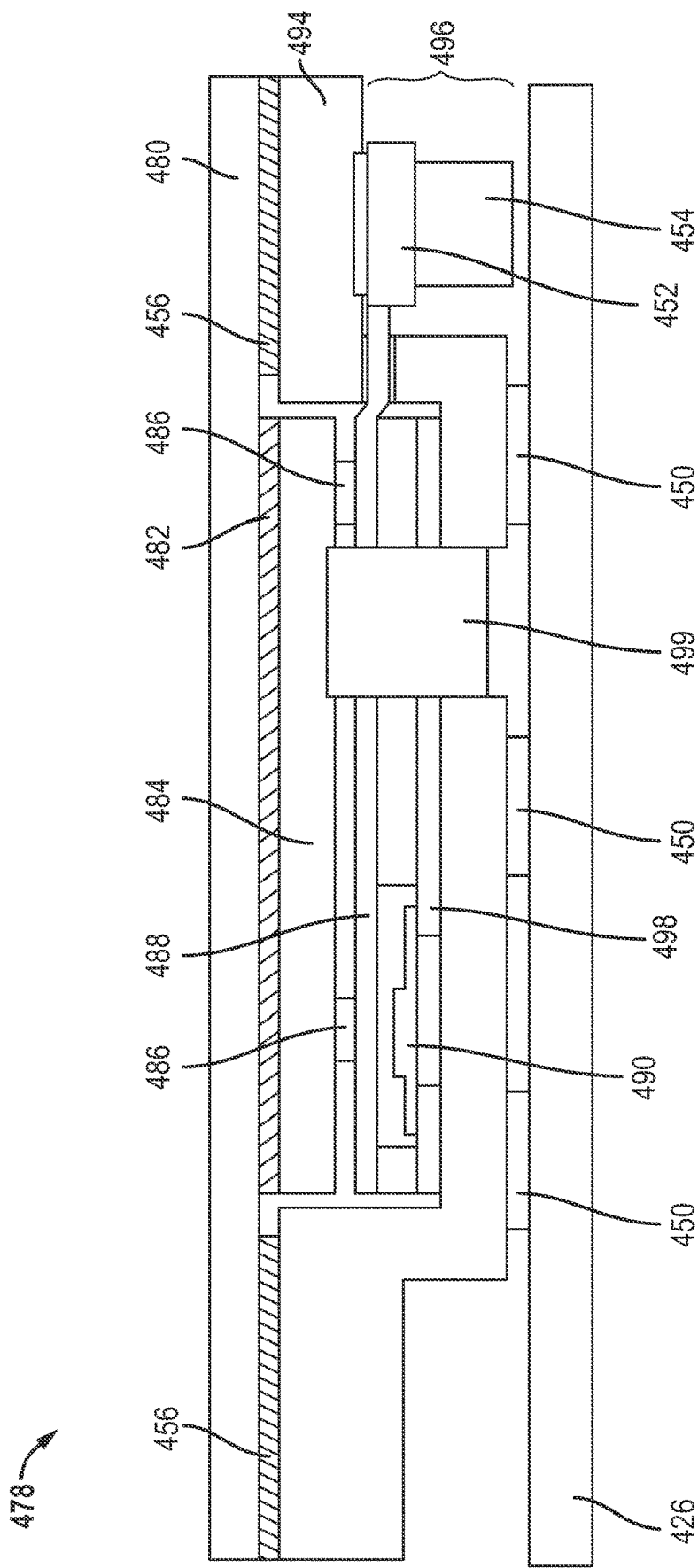
FIG. 4A is a side cut-out block diagram of an assembly of a haptic touchpad with a seamless layer of glass and unibody C-cover support frame according to an embodiment of the present disclosure.

FIG. 4A is a side cut-out block diagram of an assembly of a haptic touchpad 478 with a seamless layer of glass 480 and unibody C-cover support frame 494 according to an embodiment of the present disclosure. As described herein the stack forming the haptic touchpad 478 may be sandwiched between the seamless layer of glass 480 and unibody c-cover support frame 494 thereby providing a location where a user may provide input to the information handling system.

The thickness of this stack forming the haptic touchpad 478 may be approximately 2.60 and 2.68 mm including the thickness of the seamless layer of glass 480 and unibody C-cover support frame 494 in an example embodiment. In an embodiment, the thickness of this stack forming the haptic touchpad 478 may be about 2.5 mm to 3 mm, for example 2.64 mm, including the thickness seamless layer of glass 480 and unibody C-cover support frame 494. The seamless layer of glass 480, in an example embodiment, may be approximately 0.5 mm or less to allow for effective force sensing and generation of haptic feedback, however too thin and the seamless layer of glass 408 may not be durable, for example below 0.2 mm. The thin haptic touchpad assembly 478 allows the haptic touchpad 478, seamless layer of glass 480, and unibody C-cover support frame 494 to be placed over a number of other devices within the information handling system. By way of an example embodiment, the seamless layer of glass 480, haptic touchpad 478, and unibody C-cover support frame 494 have been placed over a system battery 426. In FIG. 4A, the bottom surface of the unibody C-cover support frame 494 is separated from the system battery 426 using, for example, a foam 450 or other electrical or heat non-conductive spacing material. The relatively thin stack forming the haptic touchpad 478 allows for more devices to be placed within the c-cover and d-cover housing (e.g., a base portion of a laptop-type information handling system) thereby increasing the capabilities and functionalities of the information handling system.

As described herein, the haptic touchpad controller 496 may interface with the haptic touchpad 478 in order to detect an interaction between a user and the haptic touchpad 478.

This interaction between the user and the haptic touchpad 478 may be completed by a user's actuations at the haptic touchpad 478 in order to provide input to the information handling system via the haptic touchpad 478. The haptic touchpad 478 may be arranged in a stack formation that includes a seamless layer of glass 480, a first adhesive 482 used to secure a capacitive touch PCB 484 to a bottom side of the seamless layer of glass 480, a second adhesive 486 used to operatively couple a contact foil 488 to the bottom side of the capacitive touch PCB 484. The stack of the haptic touchpad 478 may further include a piezoelectric element array 492 including one or more piezoelectric elements 490 operatively coupled to the contact foil 488. In an embodiment, this stack forming the haptic touchpad 478 may be placed in a unibody c-cover support frame 494.

The seamless layer of glass 480 may form a palm rest and a top surface of the haptic touchpad 478. The seamless layer of glass 480 may form part of a top surface of a base portion of a laptop-type information handling system. With the seamless layer of glass 480 being placed on the top portion of the base portion of the laptop-type information handling system, a remaining portion of the top of the base portion of the information handling system may be used to house, for example, a keyboard (e.g., a QWERTY-type keyboard), a function key bar, a speaker, one or more antenna, a stylus housing for a stylus as well as other input devices of the information handling system.

The seamless layer of glass 480 may be made of a durable glass that resists breakage. In an embodiment, the unibody C-cover support frame 494 may be formed to hold the seamless layer of glass 480 on top of and within the unibody C-cover support frame 494 with a side lip that extends up along the sides of the seamless layer of glass 480. In this embodiment, the unibody C-cover support frame 494 may be made of a metal such as aluminum or other metals and alloys that prevent accidental damage to the seamless layer of glass 480. In an embodiment, the seamless layer of glass 480 may be made of an alkali-aluminosilicate sheet of glass such as Gorilla® glass produced by Corning®. Other types of glasses may be used and the present specification contemplates the use of these other glasses. In an embodiment, instead of the seamless layer of glass 480 being made of glass, a layer of ultraviolet light-cured, metal-oxide nanocoated composite material may be used. Other materials are contemplated that allow a user's touch at the capacitive touch PCB 484 to be detected during use. In an embodiment, the seamless layer of glass 480 may include acid etching, mechanical etching, coloration or other optical indication that delineates the outer boundaries of the haptic touchpad 478 formed under the seamless layer of glass 480. In another embodiment, as described in FIG. 3B, etching or other formation technique may be used to lower the level of a haptic touchpad surface portion of the seamless layer of glass 480 to form a tactile step for the location of the haptic touchpad 478 on the surface. These embodiments may allow a user to know where the actionable and actuatable portions of the haptic touchpad 478 begin and end and where input may be received as described herein.

The first adhesive used to secure the capacitive touch PCB 484 to the bottom surface of the seamless layer of glass 480 may be any type of adhesive. In an embodiment, the first adhesive 482 is layered between the seamless layer of glass 480 and the capacitive touch PCB 484 having a thickness of about 0.03 mm to 0.07 mm. In another embodiment, first adhesive 482 is layered between the seamless layer of glass 480 and the capacitive touch PCB 484 having a thickness of about 0.5 mm.

The capacitive touch PCB 484 may be made of a flexible material such as a glass, biaxially-oriented polyethylene terephthalate (BoPET) such as Mylar® produced by DUPONT®, or a glass-reinforced epoxy such as FR4 that has a flexibility to it similar to the flexibility of the seamless layer of glass 480 described herein. The capacitive touch PCB 484, in an embodiment, includes a grid of drive and sense lines to determine x- and y-touch locations on capacitive touch PCB 484 by a user. The capacitive touch PCB 484 may be placed above the layers of the haptic touchpad 478 to distribute forces from a user's finger through the capacitive touch PCB 484 and to the nearest or a plurality of nearest piezoelectric elements 490-1 formed into an array 492 of piezoelectric elements and placed below and across the bottom surface of the capacitive touch PCB 484.

In an embodiment, the capacitive touch PCB 484 may be operatively coupled to a top surface of a contact foil 488 via a second adhesive 486. In an embodiment, the second adhesive 486 may be layered between the bottom surface of the capacitive touch PCB 484 and the top surface of the contact foil 488 at a thickness of between 0.20 and 0.26 mm. In an embodiment, the second adhesive 486 may be layered between the bottom surface of the capacitive touch PCB 484 and the top surface of the contact foil 488 at a thickness of 0.24. In an embodiment, the bottom surface of the capacitive touch PCB 484 and the top surface of the contact foil 488 may be coupled together using several dots of second adhesive 486 that each have a thickness of approximately 0.23 mm. In one example embodiment, the second adhesive 486 may form a rigid dot above piezo electric element 490 to focus mechanical stress applied downward on the seamless layer of glass 480 to the piezo electric element 490 during an actuation press or click. This may provide better accuracy of detection of the downward mechanical stress applied. The capacitive touch PCB 484 may also be operatively coupled to the haptic touchpad controller 496 via a capacitive touch PCB connector 499. The haptic touchpad controller 496 may include external PCB 452 and other drive electronics 454 formed on the external PCB 452. The drive electronics 454 may include processing devices used to control the capacitive touch PCB 484 and the contact foil 488/piezoelectric elements 490.

The contact foil 488 adhered to the bottom surface of the capacitive touch PCB 484 via the second adhesive 486 may be made of any elastically resilient material that, when the contact foil 488 is bent towards a lower portion of the haptic touchpad 478, returns to its original state when the haptic touchpad 478 is no longer being actuated by the user. The contact foil 488 is a flexible material, such as polyethylene terephthalate (PET) serving as a polyester printed circuit board or other type of flexible printed circuit board, in several example embodiments. The contact foil 488 may include a number of metal traces formed thereon that electrically and communicatively couple each of the corresponding piezoelectric elements 490 of the haptic touchpad 478 to a haptic touchpad controller 496 or, alternatively, a processor of the information handling system. Formation of metal traces may be made according to a variety of methods including photolithographic techniques for applying metal or lamination of copper strips or other metal layers.

During operation of the haptic touchpad 478, the contact foil 488 may receive an electrical charge from one or more of the piezoelectric elements 490 at the metal traces that conduct the electrical charge to the processor or other controller associated with haptic touchpad 478 such as the haptic touchpad controller 496. The metal traces formed on the contact foil 488 may further be used to conduct a return haptic feedback control signal from the haptic touchpad controller 496 to the piezoelectric elements 490 of the piezoelectric element array 492 so that the voltage and current of the return haptic feedback control signal may cause the piezoelectric elements 490 to return to a planer and rigid form of piezoelectric elements 490 causing a specified haptic response to the user via the haptic touchpad 478 stack. This stiffening of the piezoelectric elements 490 may cause haptic feedback presented at the haptic touchpad 478 via the contact foil 488, second adhesive 486, capacitive touch PCB 484, first adhesive 482, and the seamless layer of glass 480 that the user may feel as a "clicking" or actuation sensation. This haptic feedback produced by this process may be relayed to the user within microseconds of the user actuating the haptic touchpad 478 such that the user physically detects a sensation that the haptic touchpad 478 was pressed. This sensation felt by the user may be present despite no actual mechanical devices such as a scissor mechanism or other types of touchpad mechanical device being present among the layers of the haptic touchpad 478. The signal to the piezoelectric elements 490 may vary magnitude and pulsing to create the desired haptic response at the haptic touchpad 478.

The piezoelectric elements 490 of the piezoelectric element array 492 may be arranged on and operatively coupled to an isolation tape or other type of substrate that prevents the arrangement of the piezoelectric elements 490 on the substrate to be changed. As described, each piezoelectric elements 490 may include a first contact point between the piezoelectric elements 490 and the contact foil 488 and a second contact point between the piezoelectric elements 490 and the contact foil 488. In this embodiment, each of the piezoelectric elements 490 may be associated with two metal traces formed on the contact foil 488 and leading to the haptic touchpad controller 496. Each of these metal traces are used to either receive an electrical signal from one or more piezoelectric elements 490 and pass that electrical signal to the haptic touchpad controller 496. The haptic touchpad controller 496, when these electrical signals are received, may send a response electrical signal to the same piezoelectric elements 490 along the second metal trace to make the piezoelectric elements 490 rigid as described. In an embodiment, a group of piezoelectric elements 490 may each be actuated via the actuation of a user along the surface of the seamless layer of glass 480 where the haptic touchpad 478 has been formed. In this example, the haptic touchpad controller 496 may interpret this actuation among the group of piezoelectric elements 490 as a localized haptic response and send a return actuation signal to the effected piezoelectric elements 490 to make each of these piezoelectric elements 490 rigid. In this embodiment, a number of remaining piezoelectric elements 490 not activated or bent via actuation of the user may not receive an electrical signal from the haptic touchpad controller 496 creating the localized haptic feedback as described. The arrangement and number of piezoelectric elements 490 may be set based on the planar size of the haptic touchpad 478, the size of the piezoelectric elements 490, and the ability of a user to feel a localized, haptic feedback from the piezoelectric elements 490. In an embodiment, the number of piezoelectric elements 490 is 10 as shown in an example embodiment at FIG. 6. However, the present specification contemplates that any number of and arrangement of piezoelectric elements 490 is contemplated herein and the example embodiments described are meant as examples that are not limiting the potential number of arrangements of piezoelectric elements 490 of the piezoelectric element array 492.

In a particular embodiment, the thickness of the second adhesive 486, contact foil 488, piezoelectric elements 490, and substrate for the piezoelectric elements 490 of the piezoelectric element array 492 may be between 0.8 and 0.84 mm. In an embodiment, the thickness of the second adhesive 486, contact foil 488, piezoelectric elements 490, and substrate for the piezoelectric elements 490 of the piezoelectric element array 492 may be about 0.8 mm with the thickness of the second adhesive 486 being approximately 0.23 mm, the thickness of the contact foil 488 being approximately 0.13 mm, the thickness of the piezoelectric elements 490 being 0.31, and the thickness of the substrate of the piezoelectric elements 490 being approximately 0.15.

As described herein, the stack of the haptic touchpad 478 may be placed within a unibody c-cover support frame 494. In an embodiment, the bottom surface of the piezoelectric element array 492 may be coated with a dielectric coating 498. The dielectric coating 498 may electrically insulate the piezoelectric element array 492 from the metal surfaces of the unibody C-cover support frame 494. The unibody c-cover support frame 494 may be formed of aluminum or another lightweight metal that supports the pressure from a user actuating the haptic touchpad 478 by pressing down on the haptic touchpad 478. In an embodiment, the unibody c-cover support frame 494 may include wells or other depressions formed to receive each of the piezoelectric elements 490 through the substrate of the piezoelectric element array 492. In this embodiment, the wells or other depressions may hold the piezoelectric elements 490 in place during use of the haptic touchpad 478. In an embodiment, the unibody c-cover support frame 494 may support only the seamless layer of glass 480, the capacitive touch PCB 484, and the piezoelectric element array 492. In another embodiment, the unibody c-cover support frame 494 may be used to also house a keyboard, a numerical keypad, or other input device as described herein. Although the unibody c-cover support frame 494 may form a portion of the c-cover of the information handling system, the c-cover may also include the upper surfaces of the keyboard and haptic touchpad 478 as well according to some definitions of a c-cover.

The stack of the haptic touchpad 478 may further include a third adhesive 483 that secures the seamless layer of glass 480 to a top surface of the unibody c-cover support frame 494. In an example embodiment, this third adhesive 483 includes a window into which the first adhesive 482 is used to couple the capacitive touch PCB 484 to the bottom surface of the seamless layer of glass 480 within the window. The thickness of the third adhesive 483 may also vary from the thickness of the first adhesive 482. In the embodiment where the first adhesive 482 has a thickness of approximately 0.05 mm, the thickness of the third adhesive 483 may be between 0.225 and 0.23 mm. This variance in layer thickness between the first adhesive 482 and the second adhesive 486 may allow for the small deflection of the seamless layer of glass 480 over the haptic touchpad 478 that is about 0.1 mm of deflection. With this relatively small amount of deflection the user may be able to both use the capacitive touch PCB 484 as well as actuate the piezoelectric elements 490 of the piezoelectric element array 492 as described herein. To also help facilitate the ability of the seamless layer of glass 480 to be deflected by about 0.1 mm at the haptic touchpad 478, the planar dimensions of the stack of the haptic touchpad 478 may be smaller than the size of the window formed in the third adhesive 483. This adhesive offset of the third adhesive 483 from the haptic touchpad 478 may be as little as 1 mm and a great as 4 mm.

This allows that relatively small actuation deflection of the haptic touchpad 478 to be detected by the piezoelectric elements 490 and haptic touchpad controller 496 as compared to a dive board-type touchpad.

Figure 4B:
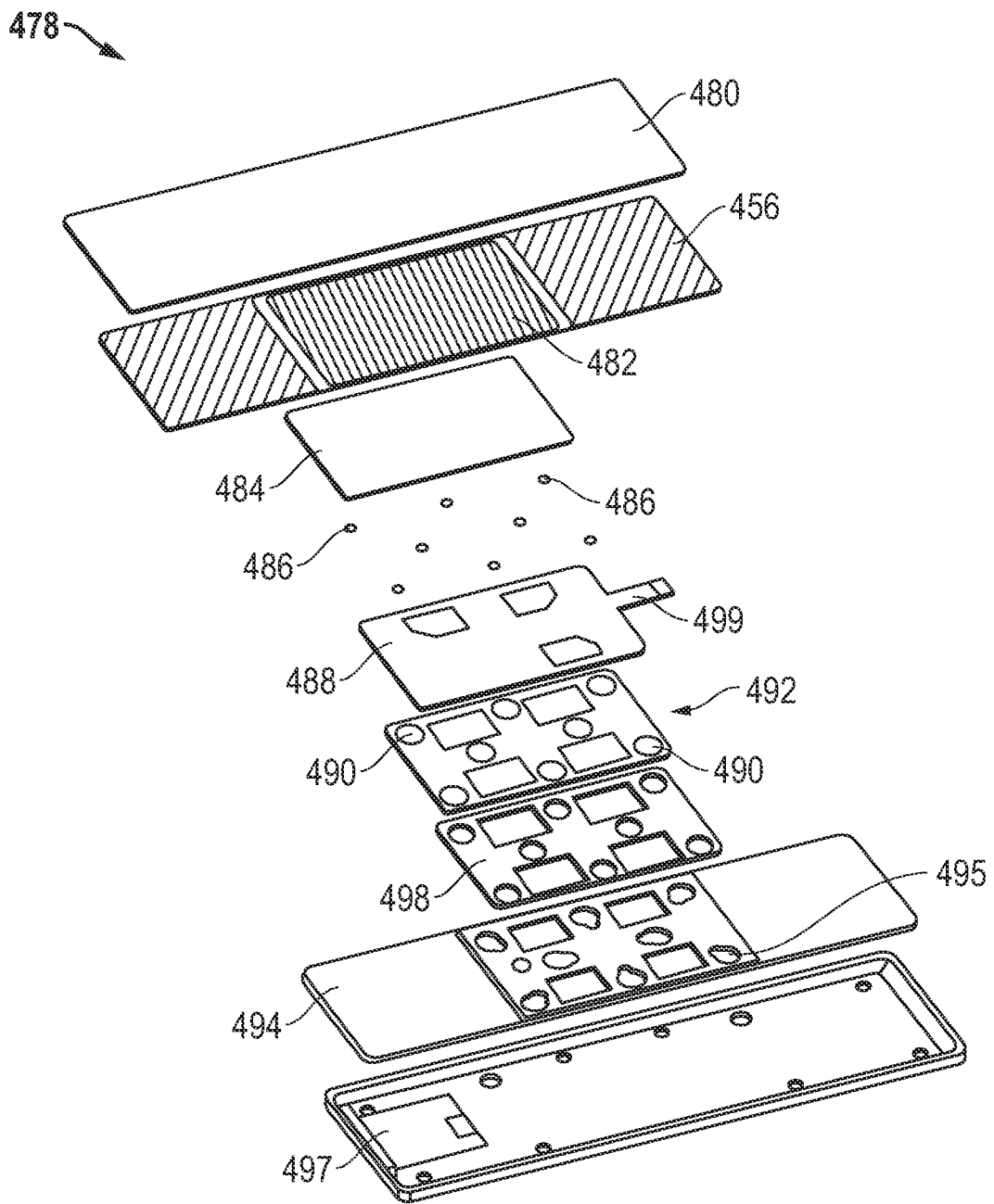
FIG. 4B is an exploded perspective view of an assembly of a haptic touchpad with a seamless layer of glass and unibody C-cover support frame according to an embodiment of the present disclosure.

FIG. 4B is an exploded perspective view of an assembly of a haptic touchpad 478 with a seamless layer of glass 480 and unibody C-cover support frame 494 according to an embodiment of the present disclosure. Similar elements as shown in FIG. 4A is shown also in FIG. 4B. The stack that forms the haptic touchpad 478 may include those similar elements such as the seamless layer of glass 480, the first adhesive 482, the capacitive touch PCB 484, the second adhesive 486 (in the form of dots), the contact foil 488 with its capacitive touch PCB connector 499, and the piezoelectric element array 492 with one or more piezoelectric elements 490. These may be adhered together, and the stack may be secured to the unibody C-cover support frame 494 using a third adhesive 456 as described herein.

FIG. 4B further shows the use of a dielectric coating 498 used to apply to a bottom surface of the piezoelectric element array 492. This dielectric coating 498 prevents an electrical coupling between the piezoelectric elements 490 of the piezoelectric element array 492 with the metallic surfaces of the unibody C-cover support frame 494. This allows the stack of forming the haptic touchpad 478 to be inserted into the housing of the information handling system as a separate and replaceable unit within the information handling system.

As shown in FIG. 4B, the unibody C-cover support frame 494 may include a number of piezoelectric element recesses 495. The number of piezoelectric element recesses 495 may match up with the number and placement of the piezoelectric elements 490 as they are arranged in the piezoelectric element array 492. In an embodiment, the piezoelectric element recesses 495 may allow a central portion of the piezoelectric elements 490 to be deflected into the piezoelectric element recesses 495 in order to create the electrical energy from the individual piezoelectric elements 490. In an embodiment, the deflection of the central portion of the piezoelectric elements 490 may be less than 0.1 mm as described herein. Again, this electrical charge is received at one or more metal traces formed on the contact foil 488 and passed to a haptic touchpad controller 496. In an embodiment, the capacitive touch PCB connector 499 may also provide x- and y-coordinate touch data to the haptic touchpad controller 496 to determine at the haptic touchpad controller 496 which of the piezoelectric elements 490 to send a response electrical charge to in order to create the haptic feedback at the haptic touchpad 478 as described herein.

FIG. 4B further shows a base support layer 497 which may be part of a D-cover in some embodiments or may be a base support layer for the haptic touchpad assembly. As a D-cover it may be used as a second housing portion to house a number of devices within a base portion of the information handling system along with the C-cover (e.g., including the seamless layer of glass 480, the stack forming the haptic touchpad 478, and the unibody C-cover support frame 494). The base support layer 497 may be made of a metal and be operatively couplable to, for example, the unibody C-cover support frame 494. In an embodiment such as the example presented in FIG. 4A, the base support layer 497 may house a battery below the stack forming the haptic touchpad 478. As such, the thickness of the stack forming the haptic touchpad 478 may be thin enough to be placed above the battery thereby increasing the available space formed within the base support layer 497 and the number and variety of devices used in the base portion of the information handling system.

FIG. 4 is an exploded perspective view of an assembly of a haptic touchpad 478 with a seamless layer of glass 480 and unibody C-cover support frame 494 according to another embodiment of the present disclosure. Similar elements as shown in FIG. 4A and FIG. 4B as shown also in FIG. 4. The stack that forms the haptic touchpad 478 may include those similar elements such as the seamless layer of glass 480, the first adhesive 482, the capacitive touch PCB 484, the second adhesive (not shown), the contact foil (not shown) with its capacitive touch PCB connector, and the piezoelectric element array 492 with one or more piezoelectric elements 490. These may be adhered together and the stack may be secured to the unibody C-cover support frame 494 using a third adhesive 456 as described herein.

A dielectric coating (not shown) may also be used and applied to a bottom surface of the piezoelectric element array 492. This dielectric coating prevents an electrical coupling between the piezoelectric elements 490 of the piezoelectric element array 492 with the metallic surfaces of the unibody C-cover support frame 494. This allows the stack of forming the haptic touchpad 478 to be inserted into the housing of the information handling system as a separate and replaceable unit within the information handling system.

As shown in FIG. 4, the unibody C-cover support frame 494 may include a number of piezoelectric element recesses 495. The number of piezoelectric element recesses 495 may match up with the number and placement of the piezoelectric elements 490 as they are arranged in the piezoelectric element array 492. In an embodiment, the piezoelectric element recesses 495 may allow a central portion of the piezoelectric elements 490 to be deflected into the piezoelectric element recesses 495 in order to create the electrical energy from the individual piezoelectric elements 490. In an embodiment, the deflection of the central portion of the piezoelectric elements 490 may be less than 0.1 mm as described herein. Again, this electrical charge is received at one or more metal traces formed on the contact foil and passed to a haptic touchpad controller 496. In an embodiment, the capacitive touch PCB connector (not shown) may also provide x- and y-coordinate touch data to the haptic touchpad controller 496 to determine at the haptic touchpad controller 496 which of the piezoelectric elements 490 to send a response electrical charge to in order to create the haptic feedback at the haptic touchpad 478 as described herein. Again, the haptic touchpad controller 496 may include external PCB 452 and other drive electronics 454 formed on the external PCB 452. The drive electronics 454 may include processing devices used to control the capacitive touch PCB 484 and the contact foil/piezoelectric elements 490.

The unibody C-cover support frame 494 shown in FIG. 4 includes an extended portion formed as a keyboard portion 472. The keyboard portion 272 of the unibody C-cover support frame 494 may be formed (e.g., via computer numerical control (CNC) automated milling) to facilitate the insertion of a keyboard that includes any number of keys arranged in any manner so as to receive input from a user via selective actuation of those keys. In an embodiment, the keys may be arranged similar to a QWERTY-type keyboard layout or any other alphabetic, symbolic, or numeric layout. In an embodiment, the keys may be any number of keys from 1 to infinity. As described herein, the unibody C-cover support frame 494 may be formed to hold the seamless layer of glass 480 within the unibody c-cover support frame 494 with a side lip. In this embodiment, the unibody c-cover support frame 494 may be made of a metal such as aluminum or other metals and alloys that prevent accidental damage to the seamless layer of glass 480.

The unibody C-cover support frame 494 may form a portion of the c-cover as described herein. The c-cover may further include the keyboard, the haptic touchpad 478, the seamless layer of glass 480 along with other devices and housings used to cover the devices housed within the base portion of the information handling system. In an embodiment, other devices of the information handling system such as a processor, a battery, a memory device, a cooling device, an antenna, among others may be housed above or below the unibody C-cover support frame 494 such that the user cannot gain physical access to these devices.

Figure 6:
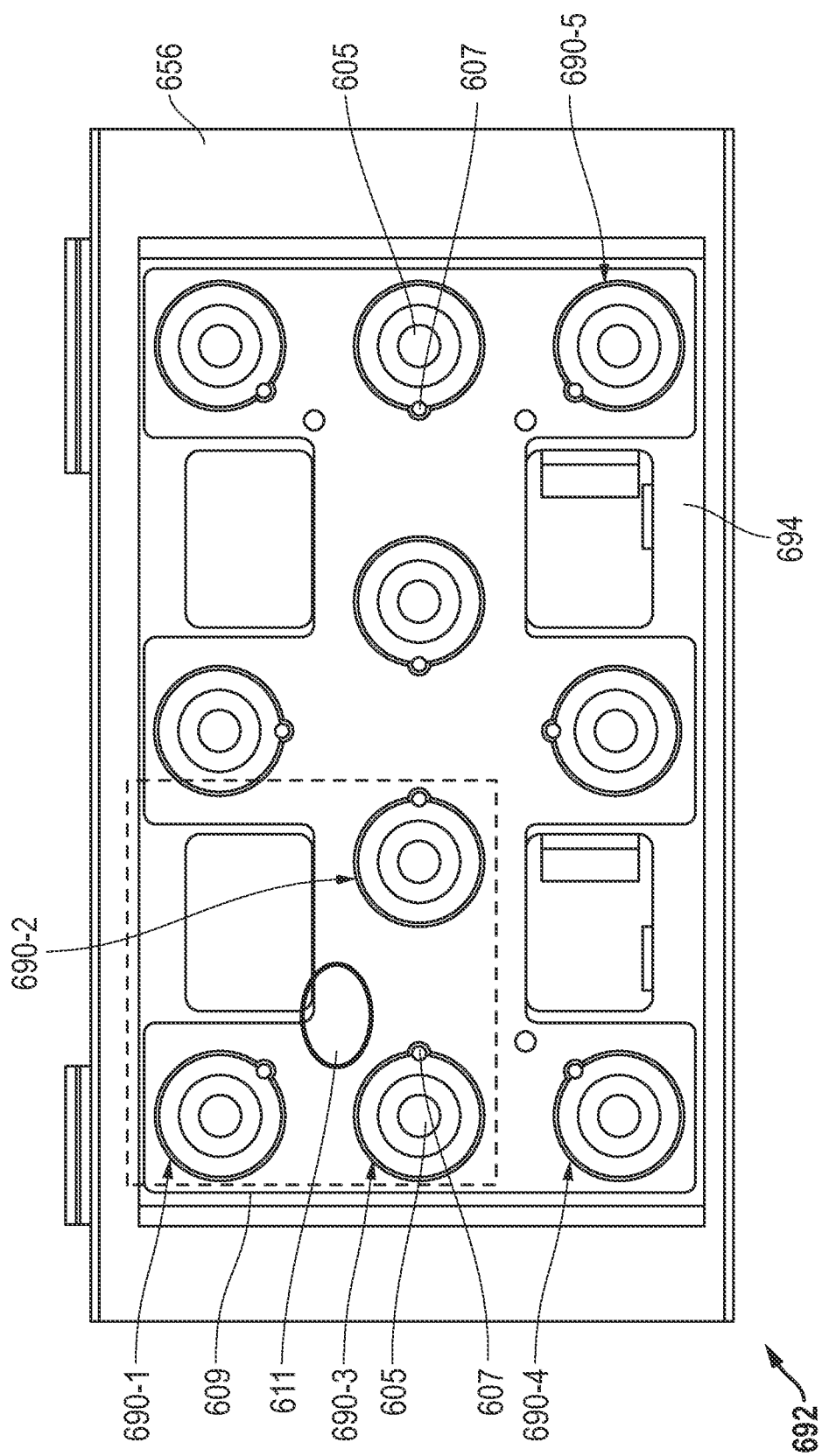
FIG. 6 is top view of a piezoelectric element array of a touchpad assembly according to an embodiment of the present disclosure.

FIG. 6 is top view of a piezoelectric element array 692 of a haptic touchpad assembly according to an embodiment of the present disclosure. In this embodiment, the seamless layer of glass (not shown), the first adhesive (not shown), the capacitive touch PCB (not shown), the second adhesive, and the contact foil (not shown) of FIGS. 4A, 4B, and 5 has been removed with the top side of the piezoelectric element array 692 being shown in the window formed in the third adhesive 656. As described herein, the third adhesive 656 is used to secure the seamless layer of glass to the unibody C-cover support frame as described herein.

As described herein, the contact foil may be made of any elastically resilient material that, when any given key or location on the touchpad is actuated or the contact foil is bent, the contact foil returns to its original state when the contact foil is no longer subjected to a force used to bend the contact foil. The contact foil layer 900 may be a flexible printed circuit layer in an example embodiment.

The contact foil may be used to communicatively and electrically couple the piezoelectric elements 690 to a controller such as the haptic touchpad controller described in connection with FIGS. 4A and 4B. As described herein, the piezoelectric elements 690 may be electrically coupled to a number of metal traces via a first electrical contact point 605 and a second electrical contact point 607. In a specific embodiment, a piezoelectric layer of the piezoelectric elements 690 may be electrically coupled to the first metal trace on the contact foil via the first electrical contact point 605. Similarly, a conductive metal plate layer of the piezoelectric elements 690 may be electrically coupled to a second metal trace on the contact foil via a second electrical contact point 607. The first electrical contact point 605 and second electrical contact point 607 may be, in an embodiment, a solder point. In an embodiment, the contact foil layer may further include a serial communication coupling device. The serial communication coupling device may communicatively couple the first electrical contact point 605 via a first metal trace and the second electrical contact point 607 via a second metal trace (among other metal traces associated with each of the piezoelectric elements 690) to a processor or haptic touchpad controller for processing of electrical charges received from the piezoelectric layer and sending an electrical voltage having a current to the second electrical contact point 607 at the conductive metal plate layer according to the embodiments described herein.

As described herein, the user may touch the haptic touchpad at a touch location of which an example touch location 611 is shown. Although the example touch location 611 is not directly over a single piezoelectric element 690 the deflection of the other layers of the haptic touchpad stack may cause sufficient deflection to cause activation of a plurality of piezoelectric elements 690-1, 690-2, 690-3, 690-4, 690-5. In the example embodiment shown in FIG. 6, a first piezoelectric element 690-1, a second piezoelectric element 690-2, and a third piezoelectric element 690-3 are close enough within a localized actuation zone 609 to the example touch location 611 so as to be actuated. This creates, in this embodiment, a localized actuation zone 609 for a haptic response from one or more of those piezoelectric elements 690-1, 690-2, 690-3.

In one example embodiment, the activation of the first piezoelectric element 690-1, second piezoelectric element 690-2, and third piezoelectric element 690-3 may be different had the user's touch been detected at the capacitive touch PCB layer as being directly over a single piezoelectric element 690-1, 690-2, 690-3, 690-4, or 690-5. In the example of FIG. 6, because the example touch location 611 is in between the piezoelectric elements 690-1, 690-2, 690-3 as detected by the capacitive touch PCB, the amount of voltage and current applied to these piezoelectric elements 690-1, 690-2, 690-3 by the haptic touchpad controller to create the haptic feedback may be reduced. In this embodiment, the exact voltage and current applied may be based on the distance to each of these piezoelectric elements 690-1, 690-2, 690-3. Thus, in an embodiment, after the haptic touchpad controller has received a signal via the contact foil that these three piezoelectric elements 690-1, 690-2, 690-3 have been compressed (e.g., piezoelectric elements create and pass a signal electrical current to the haptic touchpad controller via the metal traces), the detected x- and y-locations of the touch on the capacitive touch PCB is also received. The haptic touchpad controller may then, in an example embodiment, access a look-up table and assign a voltage and current to be applied to each of the piezoelectric elements 690-1, 690-2, 690-3 effected based on the distance of these piezoelectric elements 690-1, 690-2, 690-3 from the example touch location 611 within the localized actuation zone 609 in one example embodiment. The haptic touchpad controller may then send those electrical signals at their specific voltages and currents to each of the individual piezoelectric elements 690-1, 690-2, 690-3 in order to create the haptic feedback to the user's finger. It is appreciated that as the example touch location 611 is moved closer to any given piezoelectric element 690-1, 690-2, 690-3, 690-4, 690-5, the voltage and current applied to that piezoelectric element 690-1, 690-2, 690-3, 690-4, 690-5 is increased. Similarly, as the example touch location 611 is moved further away from any given piezoelectric element 690-1, 690-2, 690-3, 690-4, 690-5, the voltage and current applied to that piezoelectric element 690-1, 690-2, 690-3, 690-4, 690-5 is reduced. In an embodiment, a threshold distance may be determined such that any location of an example touch location 611 that exceeds a distance from any given piezoelectric elements 690-1, 690-2, 690-3, 690-4, 690-5 results in the haptic touchpad controller not providing any electrical signal to that piezoelectric element 690-1, 690-2, 690-3, 690-4, 690-5. This may cause the user to feel the haptic feedback at a specific location of the active area or the localized actuation zone 609 of the touchpad only where the user has touched. By utilizing the response in such localized actuation zones 609, the haptic response is not felt in the palm rest area of the seamless top layer of the haptic touchpad. In some embodiments, a single piezo element may detect the applied mechanical stress of a user's press or click and also provide the localized feedback with or without additional nearby piezoelectric elements within localized actuation zone 609.

In an example embodiment, the haptic touchpad controller is capable of discerning between a single example touch location 611 by the user and, for example, an errant resting of the user's palm on the active area of the haptic touchpad. In this embodiment, the capacitive touch PCB is capable of determining that multiple, large areas of the haptic touchpad is being touched and provide that data to the haptic touchpad controller. The haptic touchpad controller, after receiving this data, may prevent any haptic feedback from being created by precenting any electrical signal from being sent to any of the piezoelectric elements 690-1, 690-2, 690-3, 690-4, 690-5. This may prevent both errant and unwanted haptic feedback at the haptic touchpad while also preventing any errant input from being received at, for example, a processor or graphic processing unit for use as input to an executing application. In an embodiment, a threshold area of the active area of the haptic touchpad may be set such that any detected touched area above that threshold indicates to the haptic touchpad controller that not haptic feedback is to be provided by the haptic touchpad controller and the touch is an errant touch.

As described herein, the layout of each of the piezoelectric elements 690-1, 690-2, 690-3, 690-4, 690-5 may be based on the size of the piezoelectric elements 690-1, 690-2, 690-3, 690-4, 690-5 as well as the area of the haptic touchpad to determine specific localized actuation such as within localized actuation zone 609 to limit haptic feedback from bleeding or extending beyond the haptic touchpad surface portion of the seamless top layer. Thus, although FIG. 6 shows that ten piezoelectric elements 690-1, 690-2, 690-3, 690-4, 690-5 are used, the present specification contemplates that more or less piezoelectric elements 690-1, 690-2, 690-3, 690-4, 690-5 may be incorporated into the piezoelectric array. Additionally, although FIG. 6 shows three piezoelectric elements 690-1, 690-2, 690-3, 690-4, 690-5 aligned on each of a left side and right side of the piezoelectric array with a diamond pattern of piezoelectric elements 690-1, 690-2, 690-3, 690-4, 690-5 placed in the center of the piezoelectric array, different arrangements of the piezoelectric elements 690-1, 690-2, 690-3, 690-4, 690-5 is also contemplated.

Figure 7:
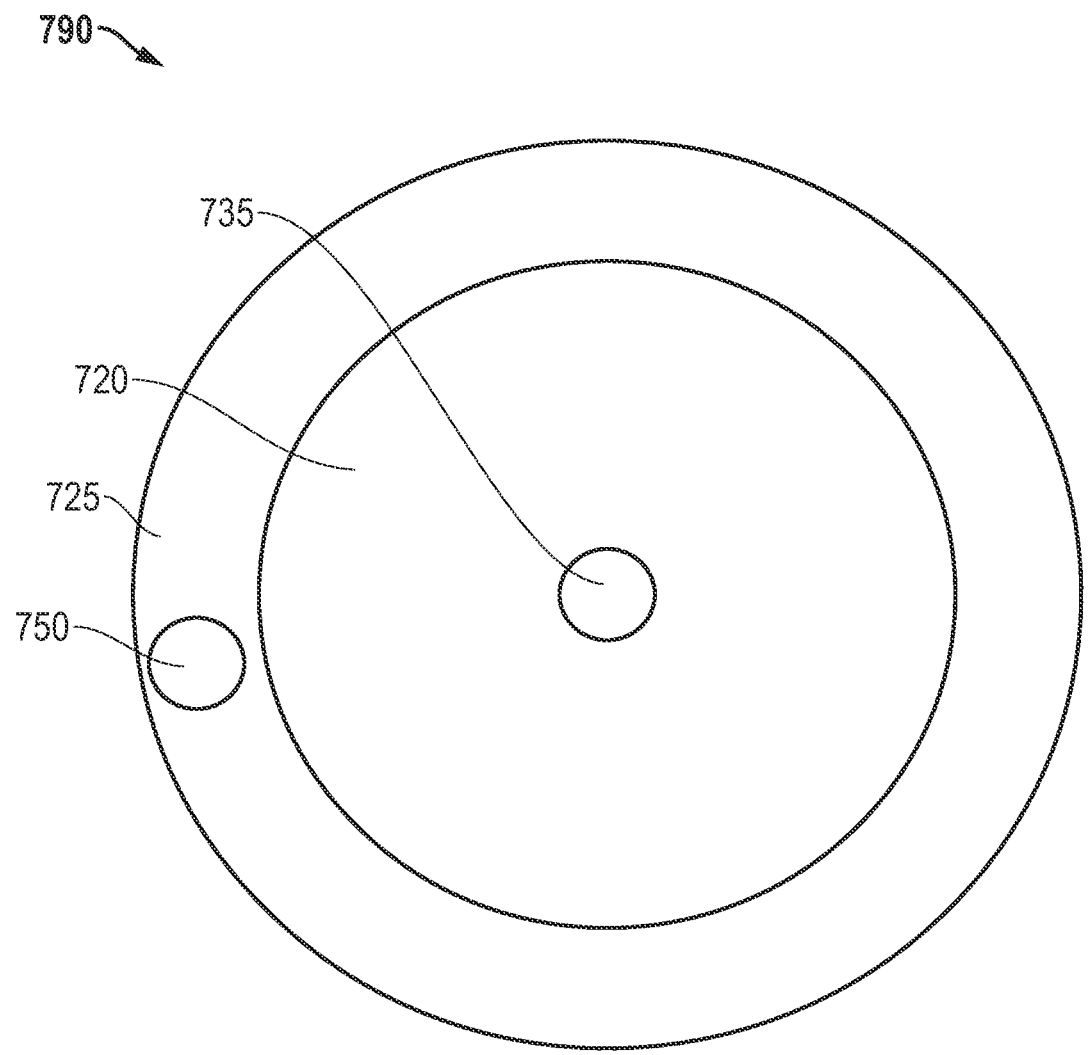
FIG. 7 is a top view of a piezoelectric element according to an embodiment of the present disclosure.

FIG. 7 is a top view of a piezoelectric element 790 according to an embodiment of the present disclosure. As described, the piezoelectric element 790 may be incorporated into an array of piezoelectric array of a haptic touchpad. In the embodiments described herein, any number of piezoelectric elements 790 may be incorporated into the information handling system so as to provide haptic feedback to a user.

In an embodiment, the piezoelectric element 790 includes a layer of piezoelectric material 720. This layer of piezoelectric material 720 may be made of any piezoelectric material including crystals, ceramics, biological matter, protein layers, among other types of materials. For ease of explanation, the layer of piezoelectric material 720 may be made of a ceramic or a crystal such a crystal such as a quartz crystal although the present specification contemplates the use of these other types of materials.

As described herein, the layer of piezoelectric material 720 may be operatively, and more specifically, electrically coupled to a contact foil as described herein. In an embodiment, the layer of piezoelectric material 720 may be electrically coupled to the contact foil layer via a first electrical contact point 735. The first electrical contact point 735 may, in an embodiment, be a soldering point that couples the layer of piezoelectric material 720 to a metal trace formed on the contact foil layer.

In an embodiment, the piezoelectric element 790 includes a metal conductive layer 725. The metal conductive layer 725 may be a brass metal plate or ring in an embodiment. The metal conductive layer 725 may also be electrically coupled to a metal trace on the contact foil layer via a second electrical contact point 750. First and second electrical contact points 735 and 750 may be a solder point in an example embodiment. Under application of a mechanical stress on the layer of piezoelectric material 720 resulting from a user actuating the seamless layer of glass above the piezoelectric element 790, the layer of piezoelectric material 720 may create an electrical charge on metal conductor layer as it is deformed or compressed, for example, into a cavity disposed below the piezoelectric element 790. This electrical charge may be passed to the metal traces via the first electrical contact point 735 and second electrical contact point 750 and may be conducted to a haptic touchpad controller as described herein.

Upon detection of the electrical charge from the layer of piezoelectric material 720, the haptic touchpad controller may send an electrical signal to the piezoelectric material 720 and the metal conductive layer 725 via those metal traces formed on the contact foil layer. The electrical signal from the haptic touchpad controller may be a variety of electrical response signals as described herein to cause the layer of piezoelectric material 720 to return a haptic feedback event. The electrical response signal generates an electrical potential between metal conductive layer 725 and first electrical contact point 735 across the piezo electric material 720 to contract that material 720 and make the piezo electric material rigid and contract causing a haptic response. The haptic feedback event may be felt by a user who caused the deformation of the layer of piezoelectric material 720 of the piezoelectric element 790 during the actuation of the haptic touchpad at a location on the haptic touchpad.

Although FIG. 7 shows a specific shape and size of the piezoelectric element 790 and metal conductive layer 725, the present specification contemplates that the piezoelectric element 790 may take on other forms and shapes as would serve a specific purpose in the operation of the haptic touchpad described herein.

Figure 8:
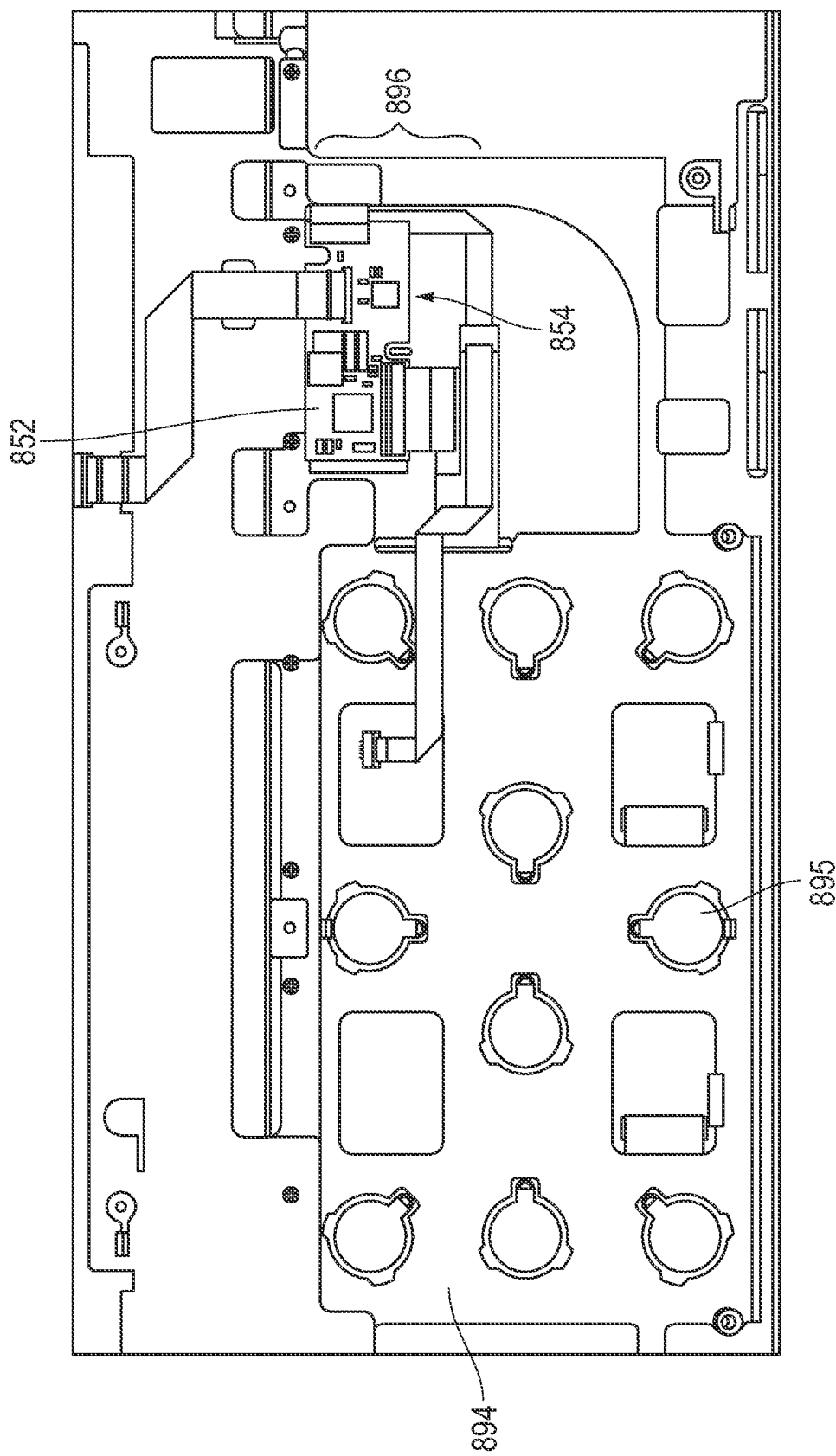
FIG. 8 is top view of a C-cover support frame of an information handling system including a touchpad controller according to an embodiment of the present disclosure.

FIG. 8 is top view of a C-cover support frame 894 of an information handling system including a touchpad controller 896 according to an embodiment of the present disclosure. As described herein, the unibody c-cover support frame 894 may be formed to hold the seamless layer of glass within the unibody c-cover support frame 894 with a side lip. In this embodiment, the unibody c-cover support frame 894 may be made of a metal such as aluminum or other metals and alloys that prevent accidental damage to the seamless layer of glass.

The unibody c-cover support frame 894 may include a number of piezoelectric element recesses 895. The number of piezoelectric element recesses 895 may match up with the number and placement of the piezoelectric elements as they are arranged in the piezoelectric element array 892 such as is shown in FIG. 6 for example. In an embodiment, the piezoelectric element recesses 895 may allow a central portion of the piezoelectric elements to be deflected into the piezoelectric element recesses 895 in order to create the electrical energy from the individual piezoelectric elements. In an embodiment, the deflection of the central portion of the piezoelectric elements may be less than 0.1 mm as described herein.

As described herein, the haptic touchpad controller 896 may include external PCB 852 and other drive electronics 854 formed on the external PCB 852. The drive electronics 854 may include processing devices used to control the capacitive touch PCB and the contact foil/piezoelectric elements. The external PCB 852 may include a number of flexible circuits that operatively couple the haptic touchpad controller to the piezoelectric element array and the capacitive touch PCB. A flexible circuit may also be used to operatively couple the haptic touchpad controller to a processor of the information handling system to provide position and selection data created by the capacitive touch PCB and piezoelectric element array, respectively.

Figure 9A:
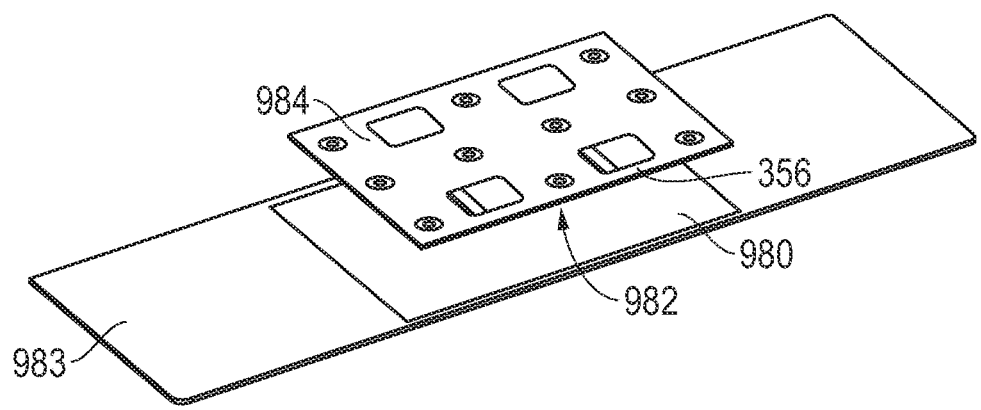
FIG. 9A is a perspective view of an assembly process of a capacitive touch printed circuit board (PCB) being operatively coupled to a seamless layer of glass according to an embodiment of the present disclosure.

FIGS. 9A through 9E show a series of sequential graphical views depicting manufacture process of a haptic touchpad 978 according to an embodiment of the present disclosure. FIG. 9A is a perspective view of an assembly process of a capacitive touch PCB 984 being operatively coupled to a seamless layer of glass according to an embodiment of the present disclosure. The haptic touchpad may be arranged in a stack formation that includes a seamless layer of glass 980 and a first adhesive 982 used to secure the capacitive touch PCB 984 to the bottom side of the seamless layer of glass 980. As show in FIG. 9A, the seamless layer of glass 980 has a third adhesive 983 layered onto a bottom side of the seamless layer of glass 980. The third adhesive 983 includes a window where the third adhesive 983 is not applied to the bottom of the seamless layer of glass 980 to allow for the relatively thinner layer of first adhesive 982 to secure the capacitive touch PCB 984 to the bottom surface of the seamless layer of glass 980. During installation of the capacitive touch PCB 984 to the bottom surface of the seamless layer of glass 980, air may be prevented from being trapped between the first adhesive 982 and the bottom surface of the seamless layer of glass 980. This may be done by using a rolling device to push any air out from between the first adhesive 982 and the bottom surface of the seamless layer of glass 980. In an embodiment, the process described in FIG. 9A may include determining whether the flatness of the capacitive touch PCB 984 to the seamless layer of glass 980 is correct.

Figure 9B:
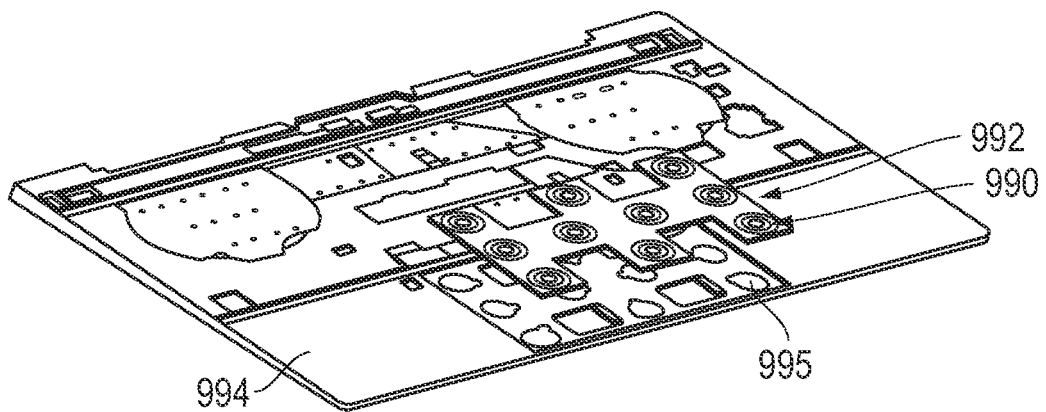
FIG. 9B is a perspective view of an assembly process of a piezoelectric element array being operatively coupled to a unibody C-cover support frame according to an embodiment of the present disclosure.

FIG. 9B is a perspective view of an assembly process of a piezoelectric element array 992 being operatively coupled to a unibody C-cover support frame 994 according to an embodiment of the present disclosure. In an embodiment, the unibody C-cover support frame 994 may be made of two mechanical parts. In this embodiment, a first section of the unibody C-cover support frame 994 may include those parts of the unibody C-cover support frame 994 that contact or are adhered to the seamless layer of glass (not shown). The second section may include a haptic touchpad chassis used to hold the stack forming the haptic touchpad layers. This second section of the unibody C-cover support frame 994 may be a bracket structure that, in an embodiment, is operatively coupled to the first section of the unibody C-cover support frame 994 via a fastener such as a screw or bolt or via a weld or adhesive, for example.

As described herein, the stack of the haptic touchpad may further include a piezoelectric element array 992 including one or more piezoelectric elements 990. The piezoelectric element array 992 may be secured to the unibody C-cover support frame 994 using an adhesive similar to the first adhesive or third adhesive described herein. In an embodiment, the bottom surface of the piezoelectric element array 992 may be coated with a dielectric coating (not shown). The dielectric coating may electrically insulate the piezoelectric element array 992 from the metal surfaces of the unibody C-cover support frame 994. The unibody c-cover support frame 994 may be formed of CNC manufactured aluminum or another lightweight metal that supports the pressure from a user actuating the haptic touchpad by pressing down on the haptic touchpad. In an embodiment the unibody c-cover support frame 994 may include recesses 995 formed to receive each of the piezoelectric elements 990 through the substrate of the piezoelectric element array 992. In this embodiment, the wells or other depressions may hold the piezoelectric elements 990 in place during use of the haptic touchpad. The process described in connection with FIG. 9B may also include verifying that the piezoelectric element array 992 is flat relative to the surface of the unibody C-cover support frame 994.

Figure 9C:
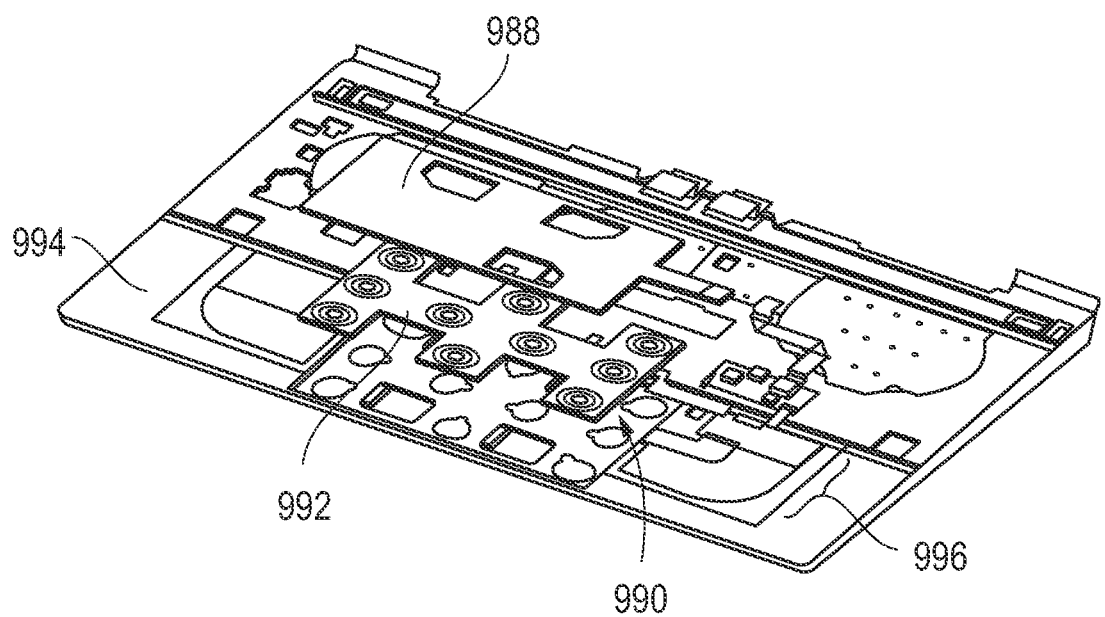
FIG. 9C is a perspective view of an assembly process of a touchpad controller operatively coupled to a unibody C-cover support frame according to an embodiment of the present disclosure.

FIG. 9C is a perspective view of an assembly process of a touchpad controller 996 operatively coupled to a unibody C-cover support frame 994 according to an embodiment of the present disclosure. The touchpad controller 996 may be secured to a portion of the unibody C-cover support frame 994 that is next to where the haptic touchpad stack is to be operatively coupled to the unibody C-cover support frame 994. A number of flexible printed circuits may be arranged across the unibody C-cover support frame 994 to be coupled to, for example a processor of the information handling system and the contact foil 988. As described herein, the contact foil 988 may be operatively coupled to each of the piezoelectric elements of the piezoelectric element array 992 via a plurality of contact points and electrical traces formed on the contact foil 988. The electrical traces may be operatively coupled to, for example, a flexible printed circuit of the touchpad controller 996. Similarly, the touchpad controller 996 may be operatively coupled to a capacitive touch PCB connector (not shown) so that the touchpad controller 996 may receive input from both the capacitive touch PCB 984 and the contact foil 988 of the piezoelectric element array 992. Again, at this time, the flatness of the haptic touchpad stack may be tested for flatness.

Figure 9D:
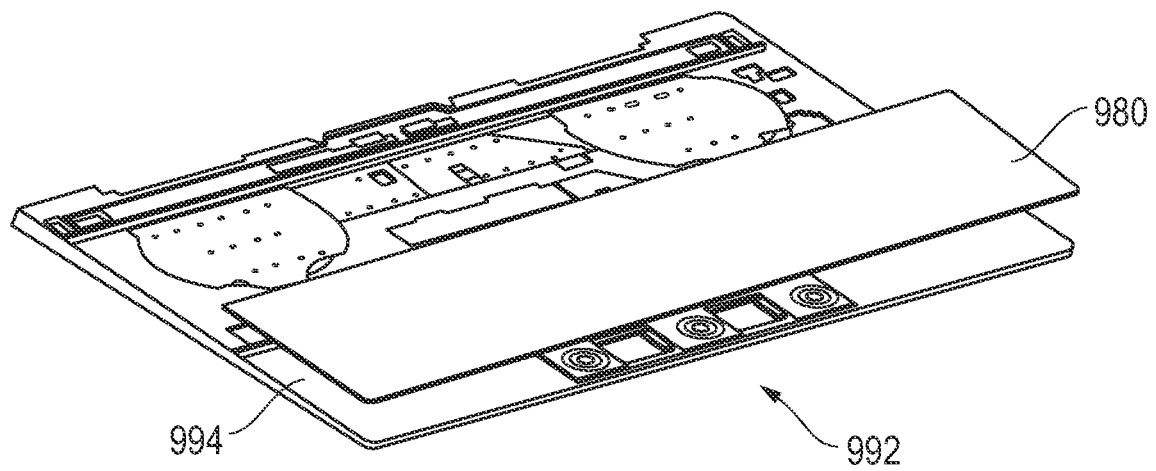
FIG. 9D is a perspective view of an assembly process of a capacitive touch printed circuit board (PCB) and seamless layer of glass being operatively coupled to the unibody C-cover support frame and piezoelectric element array according to an embodiment of the present disclosure.

FIG. 9D is a perspective view of an assembly process of a capacitive touch PCB 984 and seamless layer of glass 980 being operatively coupled to the unibody C-cover support frame 994 and piezoelectric element array 992 according to an embodiment of the present disclosure. In an embodiment, a second adhesive (not shown) is used to operatively couple the contact foil (not shown) to the bottom side of the capacitive touch PCB 984. This completes the stack forming the haptic touchpad. During this process, the third adhesive may operatively couple the seamless layer of glass 980 to side surfaces of the unibody C-cover support frame 994. Again, the capacitive touch PCB (not shown) may include a connector that is operatively coupled to the touchpad controller (not shown) prior to installation of the seamless layer of glass 980/capacitive touch PCB stack. At this point the flatness of the seamless layer of glass 980 and stack forming the haptic touchpad may be verified. Additionally, the functions of the haptic touchpad may be tested by providing power to the capacitive touch PCB 984 and the touchpad controller 996 to determine if the capacitive touch PCB 984 and piezoelectric element array 992/contact foil 988 are operating properly.

Figure 9E:
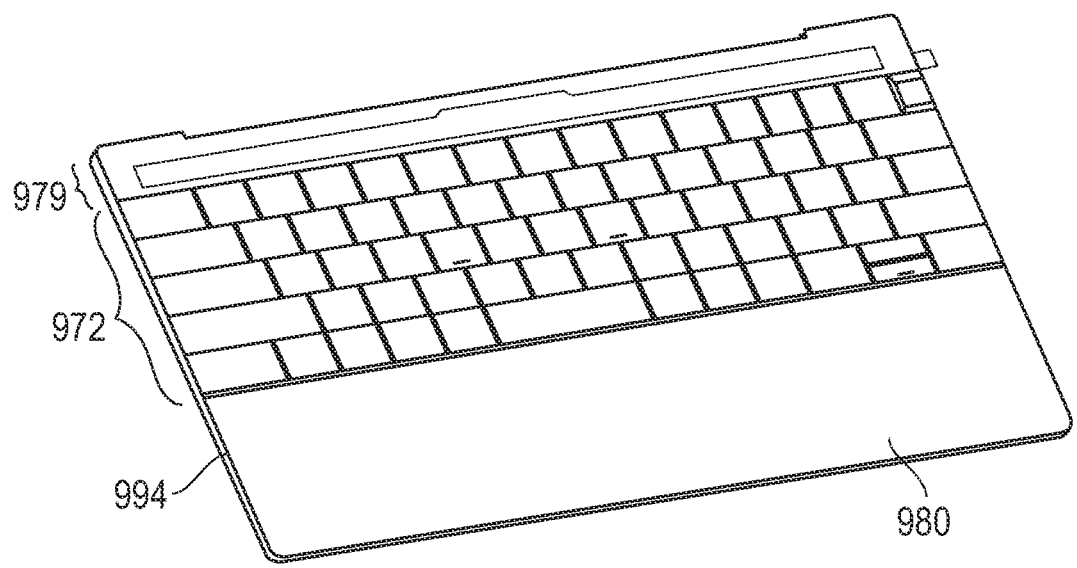
FIG. 9E is a perspective view of an assembly process of a keyboard to a unibody C-cover support frame according to an embodiment of the present disclosure.

FIG. 9E is a perspective view of an assembly process of a keyboard portion 972 to a unibody C-cover support frame 994 according to an embodiment of the present disclosure. In this embodiment, the unibody C-cover support frame 994 may include a portion where a keyboard may be inserted into the keyboard portion 972. The keyboard portion 972 may be placed above the seamless layer of glass 980. As described herein, the seamless layer of glass 980 may include a transition face that creates a transition between a keyboard portion 972 of the base portion of the information handling system. In this embodiment, an edge of the seamless layer of glass 980 may be beveled such that it interfaces seamlessly with the housing components of the keyboard portion 972. In an optional embodiment, keyboard portion 972 may not include function keys and a second seamless glass may be installed having a capacitive touch function key bar 979 over a capacitive touch PCB according to embodiments herein. The capacitive touch function key bar 979 and its capacitive touch PCB under the second seamless glass layer or other seamless top layer may be operatively coupled to a capacitive touch system controller and a driver for interfacing with the OS of the information handling system to allow actuation of function keys with capacitive touch of the capacitive touch key bar at particular locations on the second seamless top layer surface above the keyboard portion 972. In other embodiments, the area 979 may contain just a glass or other material insert to match the seamless top layer 980 made of glass or another material if not capacitive touch function key bar is used. After this, the unibody C-cover support frame 994 with the formed keyboard portion 972 and haptic touchpad may be operatively coupled to a D-cover of the base portion of the information handling system. This completed base portion may be coupled to a display portion of the information handling system via a hinge.

Figure 10:
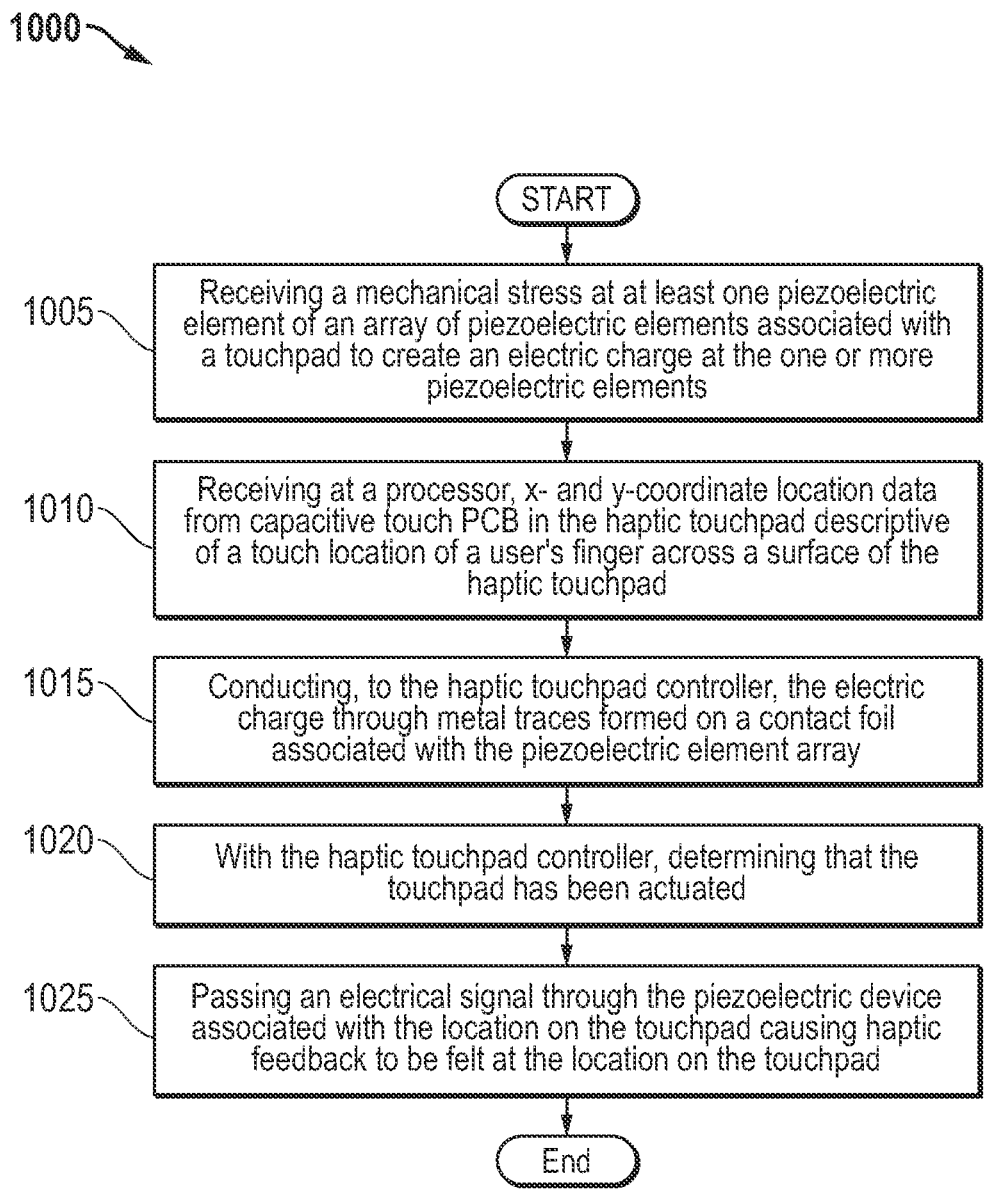
FIG. 10 is a flow diagram illustrating a method of operating a haptic touchpad of an information handling system according to an embodiment of the present disclosure.

FIG. 10 is a flow diagram illustrating a method 1000 of operating a haptic touchpad of an information handling system according to an embodiment of the present disclosure. The method 1000 may include, at block 1005, receiving at least one a piezoelectric element of an array of piezoelectric elements associated with a touchpad, a mechanical stress to create an electric charge at the one or more piezoelectric elements. As described herein, the actuation of a location on the touchpad causes a mechanical stress to be placed on one or more piezoelectric material layers of the piezoelectric elements of the piezoelectric element array. The deformation of the piezoelectric material layers may result from the application of this mechanical stress which results in the creation of the electrical charge. Deformation of the one or more piezoelectric elements into an underlying cavity formed in the unibody C-cover support frame causes compression of the piezoelectric material.

The method 1000 may continue with receiving at a processor, x- and y-coordinate location data from a capacitive touch PCB in the haptic touchpad descriptive of a touch location of a user's finger across a surface of the haptic touchpad at block 1010. The x- and y-coordinate location data may be used by a processor such as the haptic touchpad controller described herein to determine which piezoelectric elements to send an electric response signal to form the haptic touchpad controller. In these embodiments, the haptic touchpad controller may be provided with additional data from a capacitive touch layer that provides the haptic touchpad controller with a x- and y-coordinate location on the touchpad that the user has touched in addition to the actuation signal from one or more piezoelectric elements of the piezoelectric element array. Alternatively, or additionally, the number of piezoelectric elements actuated by the actuation of the touch of the user at the haptic touchpad may be used to allow the haptic touchpad controller to determine where, on the touchpad, the user has touched.

The method 1000, at block 1015, may continue with conducting, to the haptic touchpad controller, the electric charge through metal traces formed on a contact foil associated with the piezoelectric element array. As described herein, the metal traces may be formed on the contact foil and may be made of any elastically resilient material that, when any given location on the haptic touchpad is actuated or the contact foil is bent, the contact foil returns to its original state when the contact foil is no longer subjected to a force used to bend the contact foil. In an example embodiment, a flexible PCB may be used as the contact foil. The electric charge is conducted through the metal traces to an operatively coupled haptic touchpad controller.

The method 1000 may further include, with the haptic touchpad controller, determining that the touchpad has been actuated at block 1020. In this embodiment, the haptic touchpad controller may determine a location along the touchpad where the piezoelectric device from which the electrical charge was received is located: across a left side of the haptic touchpad, across a right side of the haptic touchpad, across a top portion of the haptic touchpad, across a bottom portion of the haptic touchpad, or any specific area across the surface of the haptic touchpad. As described herein, the haptic touchpad controller of the information handling system may include a look-up table. In an embodiment, the haptic touchpad controller of the information handling system may access the look-up table in order to determine how a current pulse is to be applied to any given piezoelectric element and at what voltage. In this embodiment, the exact voltage and current applied may be based on the distance to each of these piezoelectric elements. Thus, in an embodiment, after the haptic touchpad controller has received a signal via the contact foil that one or more piezoelectric elements have been compressed (e.g., piezoelectric elements create and pass a signal electrical current to the haptic touchpad controller via the metal traces), the detected x- and y-locations of the touch on the capacitive touch PCB is also received. The haptic touchpad controller may then, in an example embodiment, access the look-up table and assign a voltage and current to be applied to each of the piezoelectric elements affected based on the distance of these piezoelectric elements from the example touch location within the localized area. N another embodiment, the haptic touchpad controller may send the haptic response signal back to the piezoelectric element detecting the actuation and any other piezoelectric elements grouped within a localized actuation zone of the detecting piezoelectric element. The haptic touchpad controller may then send those electrical signals at their specific voltages and currents to each of the individual piezoelectric elements in order to create the haptic feedback to the user's finger. It is appreciated that as the example touch location is moved closer to any given piezoelectric element, the voltage and current applied to that piezoelectric element is increased. Similarly, as the example touch location is moved further away from any given piezoelectric element, the voltage and current applied to that piezoelectric element is reduced. In an embodiment, a threshold distance may be determined such that any location of an example touch location that exceeds a distance from any given piezoelectric elements results in the haptic touchpad controller not providing any electrical signal to that piezoelectric element. This may cause the user to feel the haptic feedback at a specific location of the active area of the touchpad only where the user has touched.

The method 1000 may further include, at block 1025, passing an electrical signal through the piezoelectric device associated with the location on the touchpad causing haptic feedback to be felt at the location on the touchpad. As described herein, the haptic feedback results from the electrical signal, at a determined voltage, current, or polarity being applied to the appropriate piezoelectric material layers of the piezoelectric elements. Application of the electrical signal to the piezoelectric material layers causes the piezoelectric material layer to return to its non-deformed state. The new compressed state of the piezoelectric material layer may warp the metal plate of the piezoelectric element and create a haptic bump or click to be felt by the user at the location on the touchpad actuated on the touchpad. A fast pulse of positive polarized voltage may generate a haptic event that mimics a mechanical click of a touchpad mechanical switch in one example embodiment. This method 1000, from user actuation of the touchpad to haptic feedback creation, may occur within milliseconds via the haptic touchpad controller. At this point the method 1000 may end.

Figure 11:
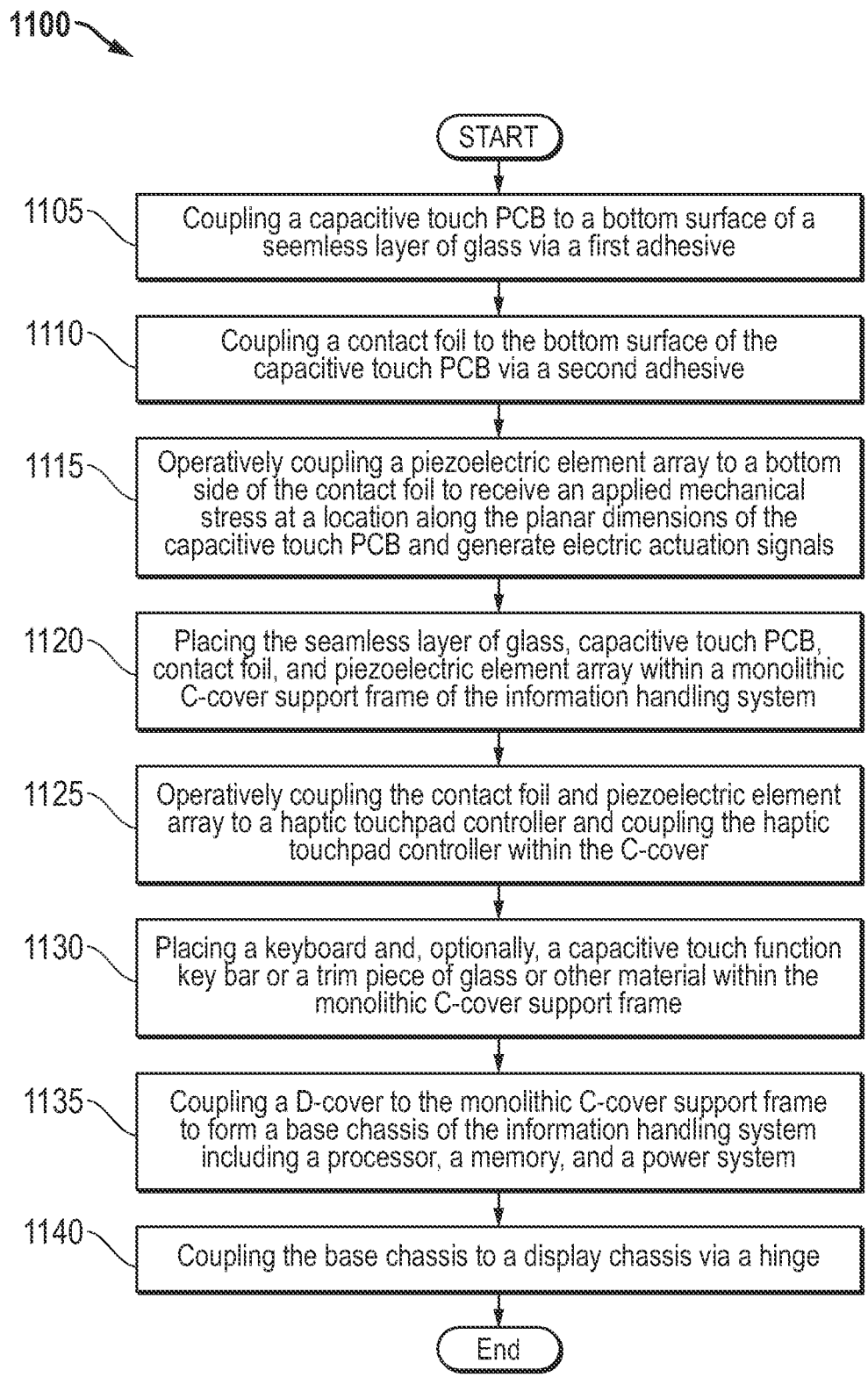
FIG. 11 is a flow diagram illustrating a method of manufacturing a haptic touchpad of an information handling system according to an embodiment of the present disclosure.

FIG. 11 is a flow diagram illustrating a method of manufacturing a haptic touchpad of an information handling system according to an embodiment of the present disclosure. The method 1100 may include, at block 1105, coupling a capacitive touch PCB to a bottom surface of a seamless layer of glass via a first adhesive. As described herein with reference to FIGS. 9A-9E, the haptic touchpad may be arranged in a stack formation that includes the seamless layer of glass and a first adhesive 982 used to secure the capacitive touch PCB 984 to the bottom side of the seamless layer of glass or other seamless top layer 980. The seamless layer of glass or other suitable material, in an embodiment, may include a third adhesive layered onto a bottom side of the seamless layer of glass or other seamless top layer. The third adhesive includes a window where the third adhesive is not applied to the bottom of the seamless layer of glass to allow for the relatively thinner layer of first adhesive to secure the capacitive touch PCB to the bottom surface of the seamless layer of glass. During installation of the capacitive touch PCB to the bottom surface of the seamless layer of glass or other seamless top layer, air may be prevented from being trapped between the first adhesive and the bottom surface of the seamless layer of glass or other seamless top layer. This may be done by using a rolling device to push any air out from between the first adhesive and the bottom surface of the seamless top layer of glass or other material.

At block 1110 the method 1100 may continue with coupling a contact foil to the bottom surface of the capacitive touch PCB via a second adhesive. As described in connection with FIGS. 9A-9E, the contact foil, in an embodiment, may be first be coupled to the piezoelectric array prior to coupling the bottom surface of the capacitive touch PCB. In the embodiment of FIG. 11, however, the contact foil may be coupled to the bottom surface of the capacitive touch PCB using a second adhesive layer. In an embodiment, the second adhesive may be layered between the bottom surface of the capacitive touch PCB and the top surface of the contact foil at a thickness of between 0.20 and 0.26 mm. In an embodiment, the second adhesive may be layered between the bottom surface of the capacitive touch PCB and the top surface of the contact foil at a thickness of 0.23. In an embodiment, the bottom surface of the capacitive touch PCB and the top surface of the contact foil may be coupled together using several dots of second adhesive that each have a thickness of approximately 0.23 mm.

The method 1100 may include, at block 1115, operatively coupling a piezoelectric element array to a bottom side of the contact foil to receive an applied mechanical stress at a location along the planar dimensions of the capacitive touch PCB and generate electric actuation signals. The contact foil adhered to the bottom surface of the capacitive touch PCB via the second adhesive may be made of any elastically resilient material that, when the contact foil is bent towards a lower portion of the haptic touchpad, returns to its original state when the haptic touchpad is no longer being actuated by the user. The contact foil is a flexible material, such as polyethylene terephthalate (PET) serving as a polyester printed circuit board or other type of flexible printed circuit board, in several example embodiments. The contact foil may include a number of metal traces formed thereon that electrically and communicatively couple each of the corresponding piezoelectric elements of the haptic touchpad to a haptic touchpad controller such as a processor of the information handling system. Formation of metal traces may be made according to a variety of methods including photolithographic techniques for applying metal or lamination of copper strips or other metal layers.

At block 1120, the method 1100 includes placing the seamless layer of glass, capacitive touch PCB, contact foil, and piezoelectric element array within a monolithic C-cover support frame of the information handling system. As described herein, the seamless layer of glass, capacitive touch PCB, contact foil, and piezoelectric element array may be secured to the monolithic C-cover support frame via the layer of third adhesive. As described herein, the third adhesive includes a window into which the first adhesive is used to couple the capacitive touch PCB to the bottom surface of the seamless layer of glass within the window. The thickness of the third adhesive may also vary from the thickness of the first adhesive. In the embodiment where the first adhesive has a thickness of 0.05 mm, the thickness of the third adhesive may be between 0.225 and 0.23 mm. This variance in layer thickness between the first adhesive and the second adhesive may allow for the small deflection of the seamless layer of glass over the haptic touchpad that is about 0.1 mm of deflection. With this relatively small amount of deflection the user may be able to both use the capacitive touch PCB as well as actuate the piezoelectric elements of the piezoelectric element array as described herein. To also help facilitate the ability of the seamless layer of glass to be deflected by about 0.1 mm at the haptic touchpad, the planar dimensions of the stack of the haptic touchpad may be smaller than the size of the window formed in the third adhesive. This offset of the third adhesive from the haptic touchpad may be as little as 1 mm and a great as 4 mm. In an embodiment, the adhesive offset may be approximately 1 mm between the top of the adhesive window in the third adhesive layer and the capacitive touch PCB, 1 mm between the bottom of the adhesive window in the third adhesive layer and the capacitive touch PCB, 4 mm between a left edge of the window in the third adhesive layer and the capacitive touch PCB, and 4 mm between a right edge of the window in the third adhesive layer and the capacitive touch PCB. This offset allows for deflection of the seamless layer of glass into the haptic touchpad such that the relatively small deflection is detected by the piezoelectric elements and haptic touchpad controller as compared to a dive board-type touchpad.

The method 1100 may continue at block 1125 with operatively coupling the contact foil and piezoelectric element array to the haptic touchpad controller and coupling the haptic touchpad controller within the C-cover. This haptic touchpad controller may receive the input from the contact foil and piezoelectric element array in order to provide activation signals to the individual piezoelectric elements. The haptic touchpad controller may also, in an embodiment, be operatively coupled to a processor of the information handling system to send input signals from the capacitive touch PCB and piezoelectric element array to provide position and selection data created by the capacitive touch PCB and piezoelectric element array, respectively.

At lock 1130, the method 1100 may include placing a keyboard within the monolithic C-cover support frame. Optionally, the method 1100 may include adding a capacitive touch function key bar under a second seamless top layer such as a glass top layer in one embodiment or may add a second seamless top layer of glass or other suitable material such as metal or plastic as a trim piece above the keyboard portion of the C-cover in another embodiment. The keyboard portion may include any number of keys arranged in any manner so as to receive input from a user via selective actuation of those keys. In an embodiment, the keys may be arranged similar to a QWERTY-type keyboard layout or any other alphabetic, symbolic, or numeric layout. In an embodiment, the capacitive touch function key bar may be installed with a capacitive touch PCB utilizing adhesive between the capacitive touch PCB and a second seamless top layer behind the keyboard and away from a user. The capacitive touch function key bar may be operatively coupled via the capacitive touch PCB via sense lines to a capacitive touch controller and a driver to execute one or more functions of the function keys thereon. Capacitive actuation may be used to actuate the function keys in an embodiment. In an alternative embodiment, a trim piece of any suitable material such as glass, metal or plastic may be installed in the C-cover support frame where necessary behind the keyboard and away from a user. In such an embodiment, the function keys, if needed, may be part of the keyboard. In an embodiment, the keys may be any number of keys from 1 to infinity. In an embodiment, the monolithic C-cover support frame may be extended to also support this keyboard, capacitive touch function key bar, or trim piece in various embodiments.

The method 1000 also includes coupling a D-cover to the monolithic C-cover support frame to form a base chassis of the information handling system including a processor, a memory, and a power system at block 1135. By coupling the D-cover to the C-cover support frame, a base portion of the information handling system may be formed. Prior to coupling the D-cover to the monolithic C-cover support frame, other devices may be placed within the D-cover and C-cover. These other devices include a processor, a battery, a memory device, a cooling device, an antenna, among others may be housed above or below the unibody C-cover support frame such that the user cannot gain physical access to these devices.

At block 1140, the method 1100 includes coupling the base chassis to a display chassis via a hinge. As described herein, the information handling system may be a laptop-type information handling system. In this example, embodiment, the laptop-type information handling system may include a base portion with a display portion operatively coupled to the base portion via a hinge mechanism. This may allow a user to view the video display device of the display portion while providing input to the information handling system via, for example, the haptic touchpad described herein. At this point the method 1100 may end.

The blocks of the flow diagrams of FIGS. 10 and 11 or steps and aspects of the operation of the embodiments herein and discussed herein need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another may communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The subject matter described herein is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. A haptic touchpad of an information handling system, comprising:
 a seamless layer of glass forming a palm rest surface and a touchpad surface;
 a touchpad assembly, including:
  a capacitive touch printed circuit board (PCB) operatively coupled to a bottom side of the seamless layer of glass via a first adhesive to detect capacitive changes due to a user's touch of the seamless layer of glass over the touchpad assembly;
  a contact foil operatively coupled to the bottom surface of the capacitive touch PCB via a second adhesive;
  a piezoelectric element array operatively coupled to a bottom side of the contact foil to receive an applied mechanical stress at a location along the planar dimensions of the capacitive touch PCB and generate electric actuation signals, wherein each piezoelectric element is operatively coupled to a plurality of metal traces in the contact foil via a center electrical contact point and an edge electrical contact point;
 a controller of the information handling system operatively coupled to the piezoelectric element array to:
  receive the electric actuation signals from at least one center electrical contact point and at least one edge electrical contact point it the piezoelectric element array placed under the mechanical stress via the contact foil; and
  send an electrical response signal to the at least one center electrical contact point and the at least one edge electrical contact point in the piezoelectric element array to cause the piezoelectric element array to generate haptic feedback; and
 a unibody C-cover support frame to support the touchpad assembly and the seamless layer of glass.

2. The haptic touchpad of claim 1 further comprising:
 a third adhesive applied to the bottom side of the seamless layer of glass to secure the seamless layer of glass to the unibody C-cover, the third adhesive creating a window for the touchpad assembly to be secured to the seamless layer of glass via the first adhesive.

3. The haptic touchpad of claim 2, wherein a thickness of the layer of third adhesive is thicker than the thickness of the layer of first adhesive to allow for the seamless layer of glass at the touchpad assembly to be deflected into the touchpad assembly a distance.

4. The haptic touchpad of claim 2 further comprising:
a sizing offset between the planar dimensions of the touchpad assembly and the planar dimensions of the window such that the planar dimensions of the touchpad assembly are smaller than the planar dimensions of the window to allow for the seamless layer of glass at the touchpad assembly to be deflected into the touchpad assembly a distance.

5. The haptic touchpad of claim 1, further comprising:
the piezoelectric element array including a plurality of piezoelectric elements arranged on a flexible printed circuit wherein the plurality of piezoelectric elements provide localized haptic feedback based on a location where the localized piezoelectric elements detect a deflection of the seamless layer of glass.

6. The haptic touchpad of claim 1, wherein the seamless layer of glass is deflected a distance of less than 0.1 mm against the capacitive touch PCB and piezoelectric element array.

7. The haptic touchpad of claim 1 further comprising:
a tactile step formed into the seamless layer of glass to define the touchpad surface over the touchpad assembly as lower than the palm rest surface to indicate the dimensions of the touchpad surface.

8. The haptic touchpad of claim 1 further comprising:
an etched boundary etched into the seamless layer of glass to define the planar dimensions of the touchpad surface over the touchpad assembly.

9. A touchpad input device for information handling system, comprising:
a top seamless layer forming a palm rest surface and a touchpad surface;
a touchpad assembly, including:
a capacitive touch printed circuit board (PCB) operatively coupled to a bottom side of the top seamless layer via a first adhesive to detect capacitive changes due to a user's touch of the seamless layer of glass over the touchpad assembly;
a contact foil operatively coupled to the bottom surface of the capacitive touch PCB via a second adhesive;
a piezoelectric element array operatively coupled to a bottom side of the contact foil to receive an applied mechanical stress at a piezoelectric element of the piezoelectric element array and generate an electric actuation signal, wherein each piezoelectric element is operatively coupled to a plurality of metal traces in the contact foil via a center electrical contact point and an edge electrical contact point;
a controller of the information handling system operatively coupled to the piezoelectric element array to:
receive the electric actuation signal from a first center electrical contact point and a first edge electrical contact point of the piezoelectric element placed under the mechanical stress via the contact foil; and
send an electrical response signal to the first center electrical contact point and the first edge electrical contact point of the piezoelectric element placed under the mechanical stress, via the contact foil, to cause the piezoelectric element to generate haptic feedback; and
a unibody C-cover support frame to support the touchpad assembly and the top seamless layer.

10. The touchpad input device of claim 9, further comprising:
a third adhesive operatively coupled to the bottom side of the top seamless layer of glass to secure the seamless layer of glass to the unibody C-cover, the third adhesive creating a window for the touchpad assembly to be secured to the seamless layer of glass via the first adhesive.

11. The touchpad input device of claim 10, wherein a thickness of the layer of third adhesive is thicker than the thickness of the layer of first adhesive to allow for the seamless layer of glass at the touchpad assembly to be deflected into the window for the touchpad assembly.

12. The touchpad input device of claim 9, wherein a second adhesive is applied a dot layer above the piezoelectric element to focus applied mechanical stress to the top seamless layer to the piezoelectric element to generate the electric actuation signal.

13. The touchpad input device of claim 9, further comprising:
the piezoelectric element array including a plurality of piezoelectric elements arranged on a flexible printed circuit wherein the plurality of piezoelectric elements provide localized haptic feedback at a haptic feedback zone based on a location where the piezoelectric element detected a deflection of the seamless layer of glass.

14. The touchpad input device of claim 9, wherein the top seamless layer is approximately 0.5 mm or less in thickness and is deflected a distance of less than 0.1 mm against the capacitive touch PCB and piezoelectric element array.

15. The touchpad input device of claim 9, further comprising:
an etched boundary etched into the top seamless layer to define the planar dimensions of touchpad surface over the touchpad assembly.

16. The touchpad input device of claim 9, wherein the top seamless layer is made of an ultraviolet light-cured, metal-oxide nanocoated composite material.

17. A method of manufacturing an information handling system with a haptic touchpad assembly, comprising:
forming a seamless layer of glass to create a unitary touchpad top surface and a palmrest top surface for installation within a C-cover of the information handling system,
operatively coupling a capacitive touch printed circuit board (PCB) to a bottom side of the seamless layer of glass under the touchpad top surface portion of the seamless layer of glass via a first adhesive to detect capacitive changes due to a user's touch of the seamless layer of glass over the touchpad assembly;
operatively coupling a contact foil to the bottom surface of the capacitive touch PCB via a second adhesive;
operatively coupling a piezoelectric element array to a bottom side of the contact foil to receive an applied mechanical stress at a location along the planar dimensions of the capacitive touch PCB and generate electric actuation signals by operatively coupling each piezoelectric element in the piezoelectric element array to a plurality of metal traces in the contact foil via a center electrical contact point and an edge electrical contact point;
placing the seamless layer of glass, capacitive touch PCB, contact foil, and piezoelectric element array of the haptic touchpad assembly within a monolithic C-cover support frame of the information handling system, wherein the seamless layer of glass forms a palm rest surface and a touchpad surface across a C-cover, wherein the monolithic C-cover support frame includes a first portion to adhere the seamless layer of glass thereon and a second portion to fit the capacitive touch PCB, contact foil, and piezoelectric element array of the haptic touchpad assembly therein;

operatively coupling the contact foil and each piezoelectric element of the piezoelectric element array to a haptic touchpad controller and coupling the haptic touchpad controller within the C-cover;

placing a keyboard within the monolithic C-cover support frame;

coupling a D-cover to the monolithic C-cover support frame to form a base chassis of the information handling system including a processor, a memory, and a power system; and coupling the base chassis to a display chassis via a hinge.

18. The method of claim 17 further comprising:

placing a third adhesive to the bottom side of the seamless layer of glass to secure the seamless layer of glass to the monolithic C-cover support, the third adhesive creating a window for deflection of the seamless layer of glass into the haptic touchpad assembly upon applied mechanical stress to the top of the seamless layer of glass at the touchpad surface.

19. The method of claim 17 further comprising:

forming a tactile step into the seamless layer of glass to define the dimension of the touchpad surface over the touchpad assembly as lower than the palm rest surface on the seamless layer of glass.

20. The input device of claim 17 further comprising:

the piezoelectric element array including a plurality of piezoelectric elements arranged on a flexible printed circuit wherein the plurality of piezoelectric elements provide localized haptic feedback based on a location where the localized piezoelectric elements detect a deflection of the seamless layer of glass.

\* \* \* \* \*